United States Patent
Laurent et al.

(10) Patent No.: US 11,967,372 B2
(45) Date of Patent: Apr. 23, 2024

(54) SHARED DECODER ARCHITECTURE FOR THREE-DIMENSIONAL MEMORY ARRAYS

(71) Applicant: Micron Technology, Inc., Boise, ID (US)

(72) Inventors: Christophe Vincent Antoine Laurent, Agrate Brianza (IT); Andrea Martinelli, Bergamo (IT); Efrem Bolandrina, Fiorano al Serio (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 17/655,957

(22) Filed: Mar. 22, 2022

(65) Prior Publication Data

US 2023/0307041 A1 Sep. 28, 2023

(51) Int. Cl.
*G11C 13/04* (2006.01)
*G11C 13/00* (2006.01)

(52) U.S. Cl.
CPC ...... *G11C 13/0023* (2013.01); *G11C 13/0004* (2013.01); *G11C 13/003* (2013.01); *G11C 2213/71* (2013.01)

(58) Field of Classification Search
CPC ............ G11C 13/0023; G11C 13/0004; G11C 13/003; G11C 2213/71; G11C 13/0026; G11C 13/0028; G11C 16/0483; G11C 2213/74
See application file for complete search history.

(56) References Cited

U.S. PATENT DOCUMENTS

| | | | | |
|---|---|---|---|---|
| 2016/0141334 A1* | 5/2016 | Takaki | ............... | G11C 13/0026 438/129 |
| 2018/0350823 A1* | 12/2018 | Or-Bach | ................ | G11C 16/10 |
| 2018/0364785 A1* | 12/2018 | Hu | ..................... | G11C 13/0007 |
| 2021/0020236 A1* | 1/2021 | Baek | .................. | G11C 13/0026 |
| 2021/0342489 A1* | 11/2021 | Kumar | ..................... | G06F 21/78 |
| 2023/0131117 A1* | 4/2023 | Kitamura | ............ | G11C 11/5628 711/154 |
| 2023/0170027 A1* | 6/2023 | Maeda | ................... | G11C 16/24 365/185.11 |
| 2023/0307042 A1* | 9/2023 | Bedeschi | ........... | G11C 13/0026 |

* cited by examiner

*Primary Examiner* — Hien N Nguyen
(74) *Attorney, Agent, or Firm* — Holland & Hart LLP

(57) ABSTRACT

Methods, systems, and devices for shared decoder architecture for three-dimensional memory arrays are described. A memory device may include pillars coupled to an access line using two transistors positioned between the pillar and the access line. The gates of the two transistors may be coupled with respective gate lines coupled with circuitry configured to bias the gate line as part of an access operation for a memory cell coupled with the pillar. In some cases, the circuitry may be positioned between tiles of the memory device, at an end of one or more tiles of the memory device, between word line combs of a tile of the memory device, or a combination thereof.

21 Claims, 11 Drawing Sheets

SECTION A-A

Unselected Memory Cell 105    Selected Memory Cell 105-a

SHARED DECODER ARCHITECTURE FOR THREE-DIMENSIONAL MEMORY ARRAYS

FIELD OF TECHNOLOGY

The following relates to one or more systems for memory, including shared decoder architecture for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
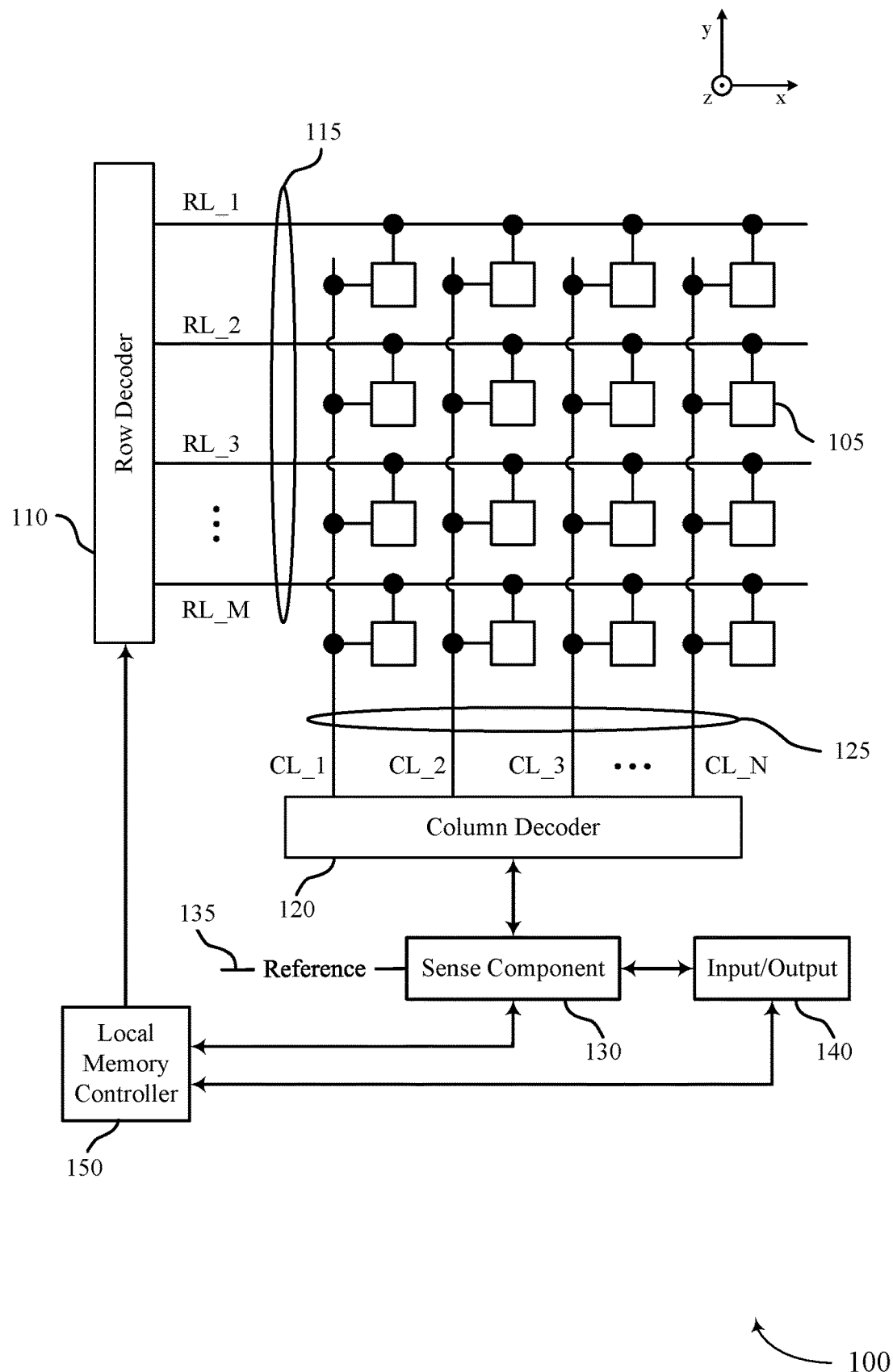
FIG. 1 illustrates an example of a memory array that supports shared decoder architecture for three-dimensional memory arrays in accordance with examples as disclosed herein.

In some memory architectures, a memory device may include a memory array arranged in a vertical architecture, such as a three-dimensional architecture, that includes memory cells arranged according to different levels (e.g., layers, decks, planes, tiers). In some cases, a memory cell may be coupled with (e.g., coupled physically between, electrically between, or both) a word line and a pillar that extends vertically through the levels of the memory array. To access the memory cell, the memory device may include circuitry configured to bias the word line and the pillar to respective voltages such that a bias is applied across the memory cell. For example, a logic state may be written to the memory cell based on a current driven through the memory cell (e.g., an amount of current, a direction of current) as a result of the bias applied across the memory cell. In some cases, to bias a pillar as part of an access operation of a selected memory cell, the memory device may be configured to couple the pillar (e.g., a selected pillar) with a bit line by activating a transistor between the selected pillar and the bit line, while isolating other pillars (e.g., one or more unselected pillars) from the bit line by deactivating respective transistors between the one or more unselected pillars and the bit line, which may prevent or reduce a biasing across unselected memory cells.

A single transistor between a pillar and a bit line, however, may not fully isolate the bit line from the pillar when the pillar is unselected. In some examples, the bit line may be configured to be biased to wide swings of voltage (e.g., biased to both negative and positive voltages to change the polarity of the signal applied to memory cells). In such examples, a single transistor may not fully isolate the pillar from the bit line in all situations. In some examples, because the transistors between the pillars and the bit line may be subject to high electrical stress (e.g., many access operations), the transistors may degrade over time, which may lead to increased leakage current, memory cell failure, decreased device performance, or a combination thereof. Accordingly, architectures to reduce improve isolation between the pillar and the bit line transistor stress are desired.

As described herein, a memory device may implement a multi-transistor architecture, such as a two-transistor architecture. For example, a memory array of the memory device may include pillars coupled with a bit line using two transistors positioned between the pillar and the bit line. As part of an access operation for a memory cell coupled with the pillar (e.g., the selected pillar), the memory device may be configured to bias the bit line to a first voltage and activate the two transistors using a second voltage to couple the pillar with the biased bit line. Additionally, the memory device may be configured to bias a gate of a first transistor and a gate of a second transistor coupling a second pillar to the bit line (e.g., an unselected pillar) to a third and fourth voltage, respectively, which may deactivate at least one of the first or second transistor during the access operation. Accordingly, the unselected pillar may remain isolated from the bit line during the access operation, and the transistors coupling the unselected pillar to the bit line may undergo less electrical stress.

In some cases, a memory device may include circuitry to bias a first gate line and a second gate line respectively coupled with the gate of the first transistor and the gate of the second transistor, such as a driver or decoder. For example, the circuitry may include one or more input signals which may be used to activate one or more pull up or pull down transistors to selectively bias the first gate line and the second gate. Additionally or alternatively, the circuitry may include a signal node coupled with the first gate, and a pair of inverters coupling the signal node with the second gate line. Accordingly, the first gate line and the second gate line may be selectively biased using a single signal applied to the signal node. In some examples, the circuitry may be positioned between tiles of the memory device, which may form a wall of vias coupled with the first gate line that may interrupt the second gate line. Additionally or alternatively, the circuitry may be positioned at an end of one or more tiles, such that the first gate line and the second gate line may be coupled with the circuitry without interruption. Thus, by implementing the multi-transistor architecture, such as the two-transistor architecture, a memory device may be implemented with reduced leakage through deactivated transistors, which may support reduced power consumption, increased accuracy of access operations, or any combination thereof, among other benefits.

Features of the disclosure are initially described in the context of memory devices and arrays with reference to FIGS. 1, 2, 3A, and 3B. Features of the disclosure are described in the context of memory arrays, circuits, and timing diagrams with reference to FIGS. 4-7D. These and other features of the disclosure are further illustrated by and described with reference to an apparatus diagram and flowcharts that relate to shared decoder architecture for three-dimensional memory arrays as described with reference to FIGS. 8-9.

FIG. 1 illustrates an example of a memory device 100 that supports shared decoder architecture for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some cases, a memory device 100 may implement a multi-transistor architecture, such as a two-transistor architecture. For example, the memory device 100 may include pillars coupled to an access line, such as a column line 125, using two transistors positioned between the pillar and the column line 125. As part of an access operation for a memory cell 105 coupled with the pillar (e.g., the selected pillar), the memory device 100 may be configured to bias the column line 125 to a first voltage and activate the two transistors using a second voltage to couple the pillar with the biased column line 125. Additionally, the memory device 100 may include circuitry, such as a set of pull up transistors and pull down transistors, to bias a gate of a first transistor and a gate of a second transistor coupling a second pillar to column line 125 (e.g., an unselected pillar) to a third and fourth voltage, respectively, which may deactivate at least one of the first or second transistor during the access operation. In some cases, the circuitry may be included in the row decoder 110, the column decoder 120, or both. Accordingly, the unselected pillar may remain at least partially isolated from the column line 125 during the access operation, and the transistors coupling the unselected pillar to the column line 125 may undergo less electrical stress.

The memory device 100 may include any quantity of non-transitory computer readable media that support shared decoder architecture for three-dimensional memory arrays. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
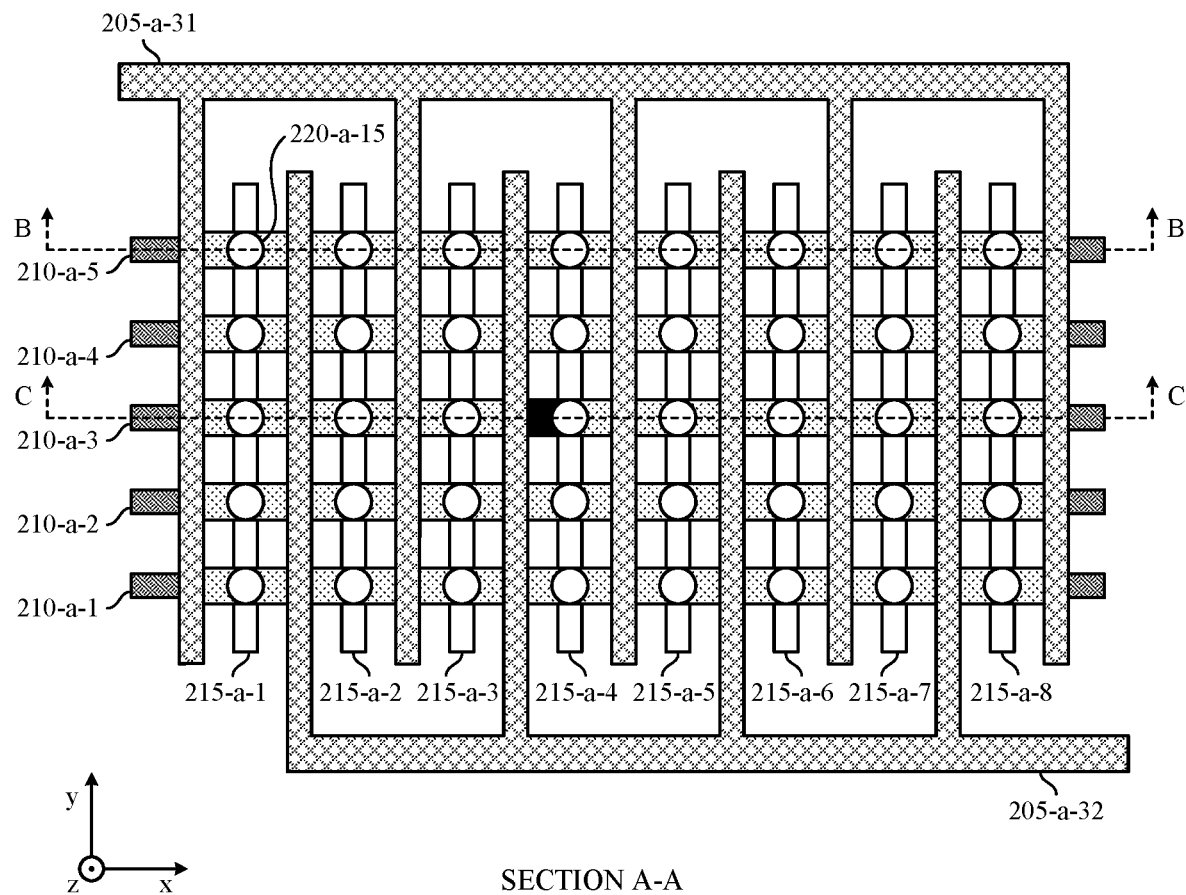
FIG. 2 illustrates a top view of an example of a memory array that supports shared decoder architecture for three-dimensional memory arrays in accordance with examples as disclosed herein.
Figure 3A:
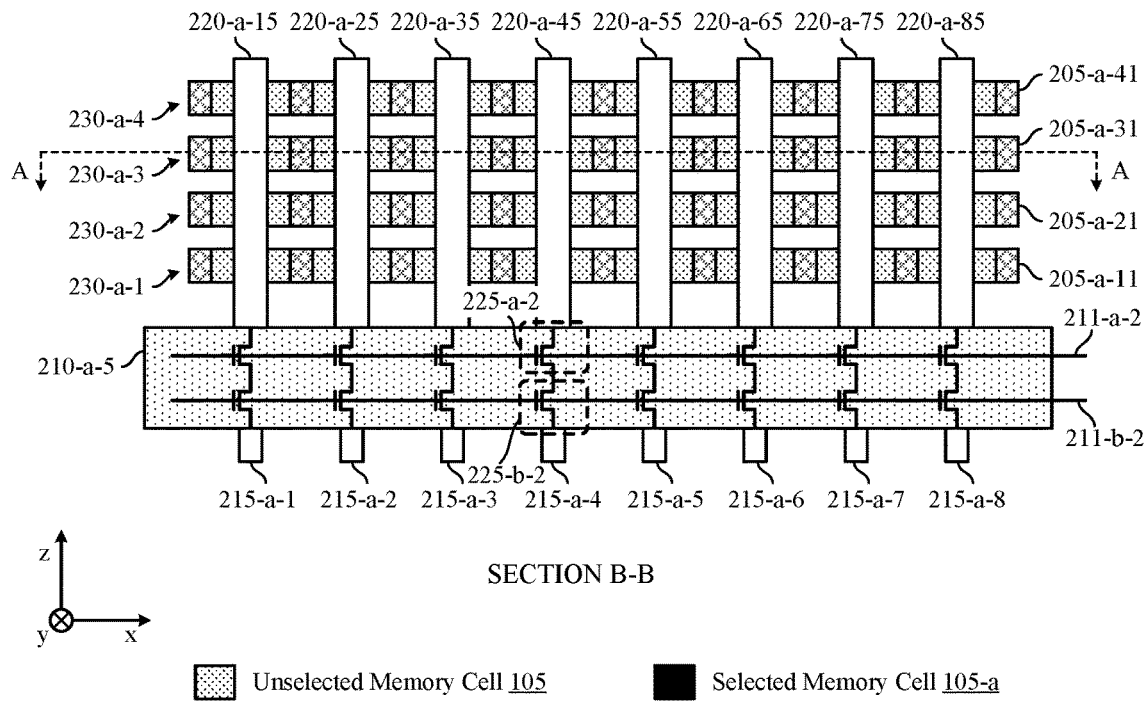
FIGS. 3A and 3B illustrate side views of an example of a memory array that supports shared decoder architecture for three-dimensional memory arrays in accordance with examples as disclosed herein.
Figure 3B:
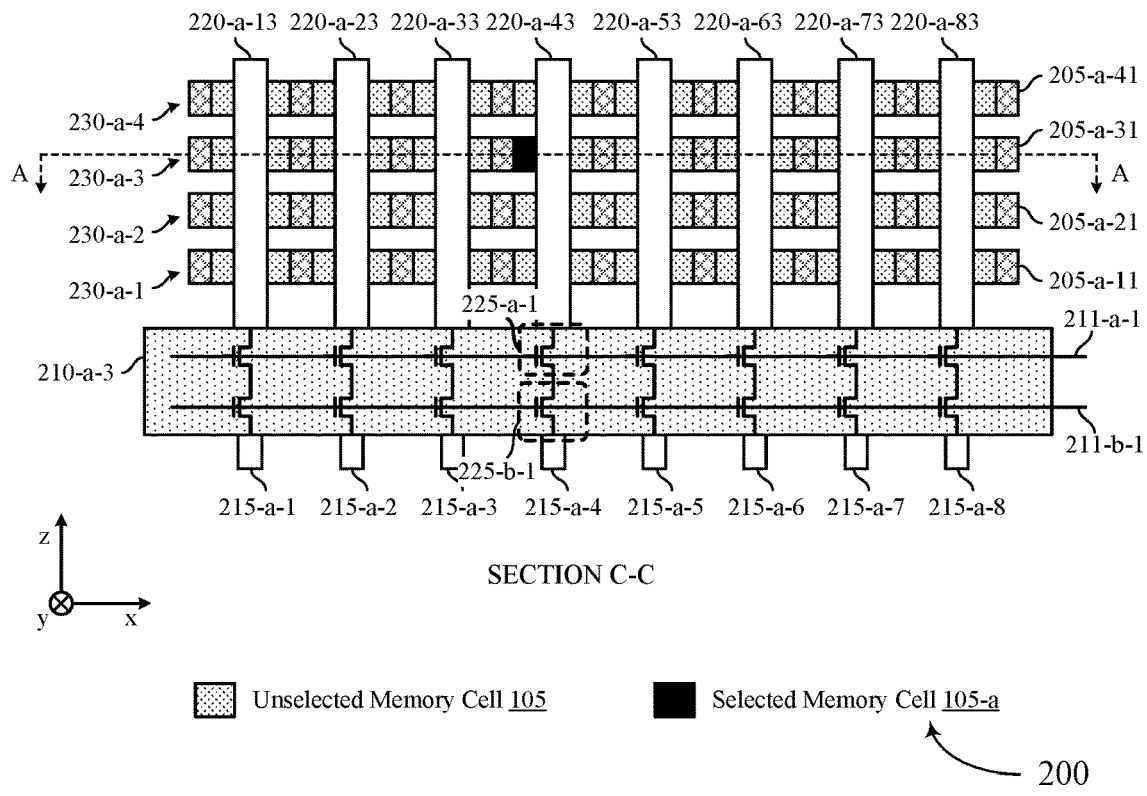

FIGS. 2, 3A, and 3B illustrate an example of a memory array 200 that supports shared decoder architecture for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-$a$-n1 and even word lines 205-$a$-n2 for a given level, n), where such word lines 205 of the same level 230 may be described as being interleaved (e.g., with portions of an odd word line 205-$a$-n1 projecting along the y-direction between portions of an even word line 205-$a$-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-$a$ of the level 230-$a$-3 may be accessed according to an intersection between the pillar 220-$a$-43 and the word line 205-$a$-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-$a$, a corresponding access bias (e.g., the first voltage) may be applied to the word line 205-$a$-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a bit line 215 (e.g., a digit line, a column line, an access line extending along the y-direction) via a pair of transistors coupled between (e.g., physically, electrically) the pillar 220 and the bit line 215. The pair of transistors for each pillar may include a first transistor 225-$a$ and a second transistor 225-$b$. In some examples, the transistors 225-$a$ and 225-$b$ may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected bit line 215, or a combination thereof may be an example of a selected column line 125 described with reference to FIG. 1 (e.g., a bit line).

The transistors 225-*a* and 225-*b* (e.g., a channel portion of the transistors 225-*a* and 225-*b*) may be activated by a set of gate lines 210 (e.g., activation lines, selection lines, an access line extending along the x-direction) coupled with respective gates of a set of the transistors 225-*a* and 225-*b* (e.g., a set along the x-direction). In some cases, the set of gates line 210 may include two gate lines, a first gate line 211-*a* and a second gate line 211-*b*. The first gate line 211-*a* may be coupled with gates of the first transistors 225-*a* of the transistor pairs and may be configured to activate or deactivate the first transistors 225-*a* based on the voltage applied to the first gate line 211-*a*. The second gate line 2211-*b* may be coupled with the gates of the second transistors 225-*b* of the transistor pairs and may be configured to activate or deactivate the second transistors 225-*b* based on the voltage applied to the second gate line 211-*a*. Each of the pillars 220 may have a first end (e.g., towards the negative z-direction, a bottom end) configured for coupling with an access line (e.g., a bit line 215). In some examples, the set of gate lines 210 (e.g., gate lines 211-*a* and 211-*b*), the transistors 225-*a* and 225-*b*, may be considered to be components of a row decoder 110 (e.g., as pillar decoder components). In some examples, the selection of (e.g., biasing of) pillars 220, or bit lines 215, or various combinations thereof, may be supported by a column decoder 120, or a sense component 130, or both.

To apply the corresponding access bias (e.g., $-V_{access}/2$) to the pillar 220-*a*-43, the bit line 215-*a*-4 may be biased with the access bias, and the set of gate lines 210-*a*-3 may be grounded (e.g., biased to 0V) or otherwise biased with an activation voltage. In an example where the transistors 225-*a*-1 and 225-*b* are n-type transistors, the set of gate lines 210-*a*-3 (e.g., gate lines 211-*a*-1 and 211-*b*-1) may be biased with a voltage that is relatively higher than the bit line 215-*a*-4 and may activate the transistors 225-*a* and 225-*b* (e.g., cause the transistors 225-*a* and 225-*b* to operate in a conducting state). Thereby coupling the pillar 220-*a*-43 with the bit line 215-*a*-4 and biasing the pillar 220-*a*-43 with the associated access bias. However, the transistors 225-*a* and 225-*b* may include different channel types, or may be operated in accordance with different biasing schemes, to support various access operations.

In some examples, unselected pillars 220 of the memory array 200 may be electrically floating when the transistors 225-*a*-1 and 225-*b*-1 for the selected pillar (e.g., pillar 220-*a*-45) are activated, or may be coupled with another voltage source (e.g., grounded, via a high-resistance path, via a leakage path) to avoid a voltage drift of the unselected pillars 220. For example, a different voltage (e.g., ground voltage) being applied to the set of gate lines 210-*a*-3 (e.g., gate lines 211-*a*-1 and 211-*b*-1) may not activate the transistors 225-*a*-1 and 225-*b*-1 coupled with the set of gate lines 210-*a*-3 (e.g., gate lines 211-*a*-1 and 211-*b*-1), because the different voltage of the set of gate lines 210-*a*-3 (e.g., gate lines 211-*a*-1 and 211-*b*-1) may not be different enough than the voltage of the other bit lines 215.

The set of gate lines 210-*a*-5 may be biased to the different voltage (e.g., gate lines 211-*a*-2 and 211-*b*-2) to isolate the conductive pillar 220-*a*-45 from the bit line 215-*a*-4 that is biased to access a memory cell coupled with the selected conductive pillar 220-*a*-43. In some examples, the gate line 211-*a*-2 may be biased to a different voltage than the gate line 211-*b*-2 to ensure that the unselected conductive pillar 220-*a*-45 is isolated from the bit line 215-*a*-4 for different biases of the bit line 215-*a*-4. Different access operations may cause the bit line 215-*a*-4 to be biased to different voltages. Using two transistors (e.g., transistors 225-*a*-2 and 225-*b*-2) biased to different gate voltages may increase a likelihood of isolation between the unselected conductive pillar and the bit line and reduce stress on the transistors. Thus, at least one of the transistors 225-*a* and 225-*b* coupled with an unselected pillar may be deactivated (e.g., operating in a non-conductive state), thereby isolating the voltage of the bit line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some cases, a memory array 200 may implement a multi-transistor architecture, such as a two-transistor architecture. For example, the memory array 200 may include pillars 220 coupled to an access line, such as a bit line 215, using two transistors (e.g., the transistors 225-*a* and 225-*b*) positioned between the pillar 220 and the bit line 215. As part of an access operation for a memory cell 105 coupled with the pillar 220 (e.g., the selected pillar), the memory array 200 may be configured to bias the bit line 215 to a first voltage and activate the two transistors 225-*a*-1 and 225-*b*-1 using a second voltage to couple the pillar 220 with the biased bit line 215. Additionally, the memory array 200 may include circuitry, such as a set of pull up transistors and pull down transistors, to bias a gate of a first transistor 225-*a*-2 and a gate of a second transistor 225-*b*-2 coupling a second pillar to the bit line 215 (e.g., an unselected pillar) to a third and fourth voltage, respectively, which may deactivate at least one of the first or second transistor during the access operation. Accordingly, the unselected pillar may remain isolated from the bit line 215 during the access operation, and the transistors coupling the unselected pillar to the bit line 215 may undergo less electrical stress. Thus, by implementing the multi-transistor architecture, such as the two-transistor architecture, a memory array 200 may be implemented with reduced leakage through deactivated transistors, which may support reduced power consumption, increased accuracy of access operations, or any combination thereof, among other benefits.

Figure 4:
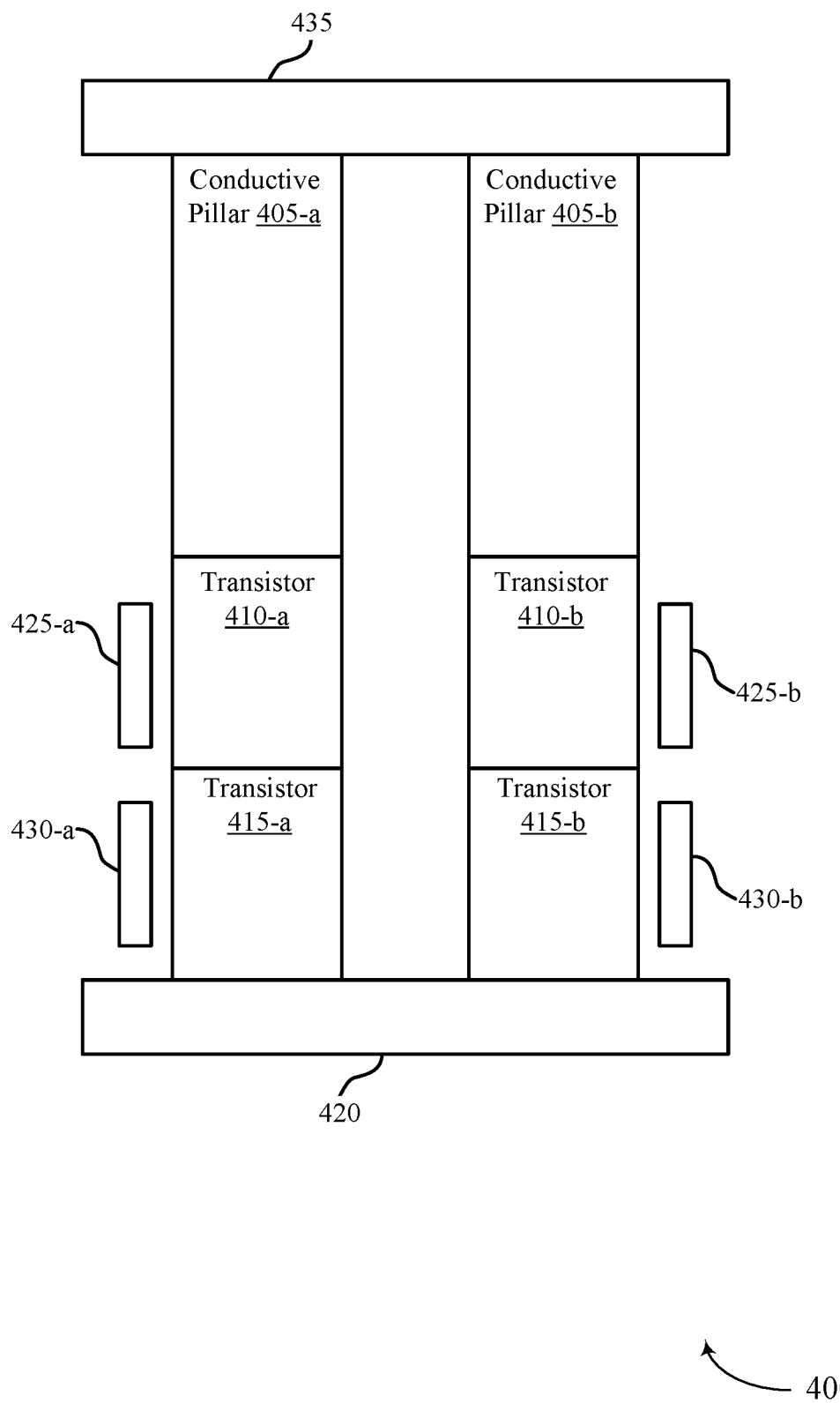
FIG. 4 illustrates an example of a memory array that supports shared decoder architecture for three-dimensional memory arrays in accordance with examples as disclosed herein.

FIG. 4 illustrates an example of a memory array 400 that supports shared decoder architecture for three-dimensional memory arrays in accordance with examples as disclosed herein. The memory array 400 may include aspects of the memory array 200 described with reference to FIGS. 2, 3A, and 3B. For example, the memory array 400 may include an arrangement of conductive pillars, such as a conductive pillar 405-a and a conductive pillar 405-b, which may be examples of pillars 220 described with reference to FIGS. 2, 3A, and 3B. The memory array 400 may also include various arrangements of word lines 205 (e.g., arranged in a comb structure) and memory cells 105 (e.g., a three-dimensional array of memory cells 105), which also may be examples of the respective components described with reference to FIGS. 2, 3A, and 3B, though such components are omitted from FIG. 4 for the sake of illustrative clarity.

In some examples, the conductive pillars 405-a and 405-b may extend through one or more levels of memory cells 105 (e.g., levels 230) and may be coupled with one or more memory cells 105 (e.g., two memory cells 105) at each level 230. For example, at each level, one or more memory cells 105 may be coupled with (e.g., coupled physically between, coupled electrically between, or both) a conductive pillar and a respective word line 205. In some examples, the conductive pillars 405-a and 405-b may couple respective memory cells with a bit line 420, which may be an example of a bit line 215. Although the illustrative example of memory array 400 includes circuitry associated with two conductive pillars, elements of the memory array 400 in accordance with examples as disclosed herein may be repeated for any quantity of conductive pillars.

The memory array 400 illustrates an example of a multi-transistor architecture (e.g., a two-transistor architecture), which may facilitate biasing the conductive pillars 405-a and 405-b (e.g., as part of an access operation) using a set of transistor to selectively couple a conductive pillar with the bit line 420. For example, the conductive pillar 405-a may be coupled with the bit line 420 through a first transistor 410-a and a second transistor 415-a. Additionally, the conductive pillar 405-b may be coupled with the bit line 420 through a third transistor 410-b and a fourth transistor 415-b.

In some cases, the transistors 410-a, 410-b, 415-a, and 415-b may be examples of thin-film transistors (TFTs), such as metal-oxide silicon field effect (MOSFET) transistors and may include a cascode transistor or cascode configuration of transistors. A cascode may be an example of a two-stage amplifier that includes of a common-emitter stage transistor feeding into a common-base stage transistor. In some cases, a cascode may be represented in figures as a single transistor. For example, a terminal of the first transistor 410-a may be coupled with a terminal of the second transistor 415-a (e.g., in a common-emitter stage feeding into a common-base stage configuration). Additionally, the transistors 410-a, 410-b, 415-a, and 415-b may be n-type transistors (e.g., n-type MOSFET or n-mos transistors). Accordingly, the first transistor 410-a and the second transistor 415-a may electrically couple the conductive pillar 405-a with the bit line 420 if a voltage difference between the bit line 420 and respective voltages of gates of the first transistor 410-a and second transistor 415-a exceed respective thresholds (e.g., the threshold voltages of the first transistor 410-a and the second transistor 415-a), and the third transistor 410-b and the fourth transistor 415-b may electrically couple the conductive pillar 405-b with the bit line 420 if a voltage difference between the bit line 420 and respective voltages of gates of the third transistor 410-b and fourth transistor 415-b exceed respective thresholds (e.g., the threshold voltages of the third transistor 410-b and the fourth transistor 415-b).

The transistors 410-a, 415-a, 410-b, and 415-b may be coupled with a respective gate line. For example, a gate of the first transistor 410-a may be coupled with a first gate line 425-a, a gate of the second transistor 415-a may be coupled with a second gate line 430-a, a gate of the third transistor 410-b may be coupled with a third gate line 425-b, and a gate of the fourth transistor 415-b may be coupled with a fourth gate line 430-b. The gate lines may be configured to independently bias respective gates of the transistors to a variety of voltages as part of access operations for memory cells coupled with the conductive pillars 405-a and 405-b. In some cases, the memory array 400 may include one or more drivers or decoders which may bias the gate lines 425-a, 430-a, 425-b, and 430-b to respective voltages as part of an access operation.

For example, a first access operation to store a first value in a memory cell coupled with the conductive pillar 405-a (e.g., a selected pillar) may include biasing the bit line 420 to a positive first voltage and coupling the bit line 420 with the conductive pillar 405-a (e.g., the access operation may be an example of a "select positive" operation). In such examples, the gate lines 425-a and 430-b may be biased to a second voltage higher than the first voltage, such that the difference between the second voltage and the first voltage may be equal to or exceed the threshold voltages of the first transistor 410-a and the second transistor 415-a. In an illustrative, non-limiting example, the bit line 420 may be biased to a voltage of 3.6 volts (V), while the first gate line 425-a and the second gate line 430-a may be biased to a voltage of 5V or to a supply voltage, though one skilled in the art may appreciate that other combinations of voltages are possible.

Additionally or alternatively, a second access operation to store a second value in a memory cell coupled with the conductive pillar 405-a (e.g., the selected pillar) may include biasing the bit line 420 to a negative third voltage and coupling the bit line 420 with the conductive pillar 405-a (e.g., the access operation may be an example of a "select negative" operation). In such examples, the gate lines 425-a and 430-b may be biased to a fourth voltage higher than the third voltage, such that the difference between the fourth voltage and the third voltage may be equal to or exceed the threshold voltages of the first transistor 410-a and the second transistor 415-a. In an illustrative, non-limiting example, the bit line 420 may be biased to a voltage of negative 3.6V, while the first gate line 425-a and the second gate line 430-a may be biased to a voltage of 0V, though one skilled in the art may appreciate that other combinations of voltages are possible.

As part of the first access operation, the second access operation, or both, the conductive pillar 405-b (e.g., the unselected pillar) be isolated or decoupled from the bit line 420. For example, the gate line 425-b may be biased to fifth voltage and the gate line 430-b may be biased to a sixth voltage less than the fifth voltage. In an illustrative, non-limiting example, the fifth voltage may be negative 3.6V, while the sixth voltage may be 0V (e.g., the fifth voltage may correspond to the third voltage and the sixth voltage may correspond to the fourth voltage) though one skilled in the art may appreciate that other combinations of voltages are possible. Accordingly, at least one of the third transistor 410-b or the fourth transistor 415-b (or both) may at least partially isolate or reduce conductance between the bit line 420 and the conductive pillar 405-b. Thus, the transistors 410-b and 415-b may reduce leakage current from the conductive pillar 405-b resulting an access operation for the conductive pillar 405-a.

In some examples, while outside an access operation for the conductive pillar 405-a, the conductive pillar 405-b, or both (e.g., during an idle mode), the first gate line 425-a and the third gate line 425-b may respectively bias the first transistor 410-a and the third transistor 410-b to the fifth voltage, while the second gate line 430-a and the fourth gate line 430-b may respectively bias the second transistor 415-a and the fourth transistor 415-b to the sixth voltage. Accordingly, while outside the access operation, the transistors 410-a, 410-b, 415-a, and 415-b may isolate or decouple the conductive pillars 405-a and 405-b from the bit line 420, which may further reduce leakage current associated with operations of the memory array 400.

In some examples, the memory array 400 may include or may be coupled with one or more decoders or drivers used to bias the gate lines 425-a, 425-b, 430-a, and 430-b. For example, the first gate line 425-a and the second gate line 430-a may be coupled with a first decoder, while the third gate line 425-b and the fourth gate line 430-b may be coupled with a second decoder. The one or more decoders may be positioned at an end of a tile of the memory array 400, between tiles of the memory array 400, within a tile of the memory array 400, or any combination thereof, as described in greater detail with reference to FIGS. 5A through 8.

Figure 5A:
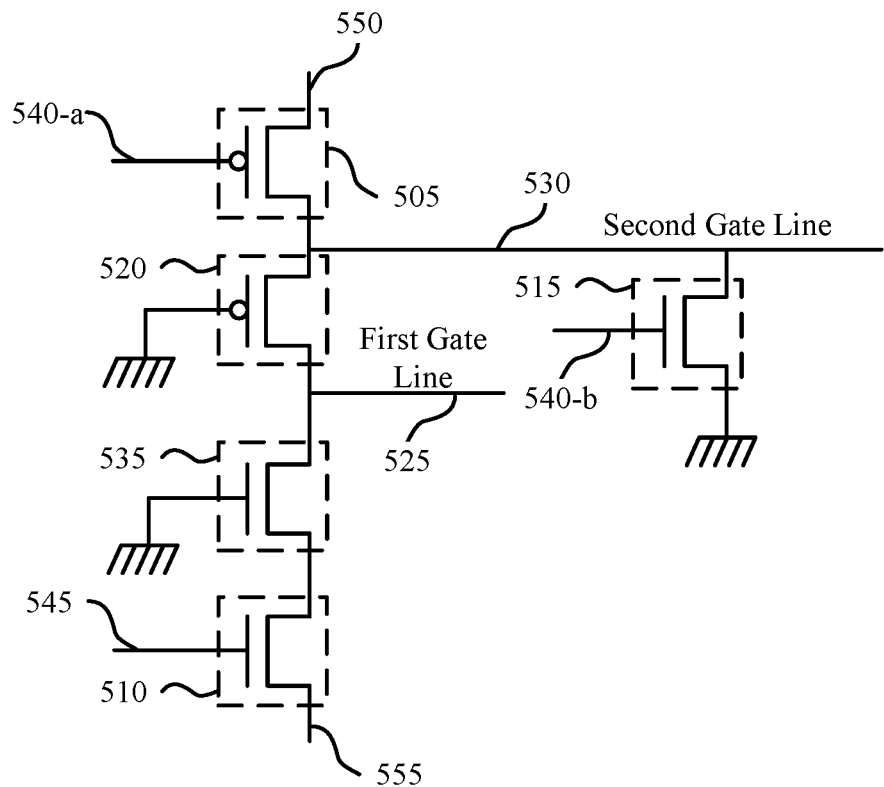
FIGS. 5A, 5B, and 5C illustrate examples of circuitry that supports shared decoder architecture for three-dimensional memory arrays in accordance with examples as disclosed herein.

FIG. 5A illustrates an example of a circuit 500-a that supports shared decoder architecture for three-dimensional memory arrays in accordance with examples as disclosed herein. The circuit 500-a may include aspects of the memory array 400 described with reference to FIG. 4. For example, the circuit 500-a may include or may be coupled with a first gate line 525 and a second gate line 530, which may respectively be examples of the first gate line 425 and the second gate line 430 as described with reference to FIG. 4. The circuit 500-a may be an example of a circuit used to bias the gate lines 425 and 430 to various voltages.

The circuit 500-a may be coupled with or may be an example of a decoder configured to bias the first gate line 525 and the second gate line 530 to one or more voltages as part of an access operation. For example, the circuit 500-a may bias the first gate line 525 and the second gate line 530 to a first voltage as part of a first access operation (e.g., to 5V, as part of a "select positive" operation as described with reference to FIG. 4). Additionally, the circuit 500-a may bias the first gate line 525 and the second gate line 530 to a second voltage less than the first voltage as part of a second access operation (e.g., to 0V, as part of a "select negative" operation as described with reference to FIG. 4). In some examples, the circuit 500-a may receive one or more input signals at one or more components of the circuit 500-a, which may determine or generate the voltages used for the access operations.

For example, the circuit 500-a may include a first transistor 505. The first transistor 505 may include a first terminal coupled with a first signal node 550 and a second terminal coupled with the second gate line 530. Additionally, the first transistor 505 may include a gate coupled with a second signal node 540-a. In some cases, the first transistor 505 may be an example of a p-type MOSFET (p-mos) transistor, and accordingly, the first transistor 505 may couple the first signal node 550 with the second gate line 530 if the difference between a voltage at the gate of the first transistor 505 and a voltage at a terminal of the first transistor 505 is less than or equal to a threshold of the first transistor 505 (e.g., a voltage threshold). The circuit 500-a may additionally include a second transistor 510. The second transistor 510 may include a first terminal coupled with a supply node 555 and a gate coupled with a third signal node 545. In some cases, the first transistor 505 may be an example of a p-mos transistor, and the second transistor 510 may be an example of an n-mos transistor.

The circuit 500-a may include one or more transistors positioned between the first transistor 505 and the second transistor 510. For example, the circuit 500-a may include a third transistor 520 and a fourth transistor 535. The third transistor 520 may be an example of a p-mos transistor, and may include a first terminal coupled with a terminal of the first transistor 505 and the second gate line 530, such that the second gate line 530 may be positioned between the first transistor 505 and the third transistor 520. Additionally the third transistor 520 may include a second terminal coupled with the first gate line 525 and a first terminal of the third transistor 535, such that the first gate line 525 may be positioned between the third transistor 520 and the fourth transistor 535. In some cases, the fourth transistor 535 may be an example of an n-mos transistor, and may include a second terminal coupled with a terminal of the second transistor 510. Accordingly, the first transistor 505, the second transistor 510, the third transistor 520, and the fourth transistor 535 may be connected in series. In some examples, the third transistor 520 and the fourth transistor 535 may each include a gate coupled with a ground node or a virtual ground node.

In some cases, the circuit 500-a may include a fifth transistor 515 coupled with the second gate line 530. For example, the fifth transistor may be an example of an n-mos transistor and may include a first terminal coupled with the second gate line 530 and a second terminal coupled with a ground node of a virtual ground node. Additionally, the fifth transistor 515 may include a gate coupled with a third signal node 540-b. In some cases, the third signal node 540-b may carry or be biased with a same signal as the second signal node 540-a. Additionally or alternatively, the second signal node 540-a may be coupled with the third signal node 540-b, or may be the same node as the third signal node 540-b, such that the gate of the first transistor 505 and the gate of the fifth transistor 515 receive the same or similar bias voltages.

The circuit 500-a may be configured to bias the first gate line 525 and the second gate line 530 to one or more voltages as part of an access operation. For example, as part of a first access operation to store a first value in a memory cell coupled with a pillar coupled with the first gate line 525 and the second gate line 530 (e.g., a selected pillar), the second signal node 540-a and the third signal node 540-b may apply a low signal (e.g., a logic "0", a low voltage) to the gate of the first transistor 505 and the gate of the fifth transistor 515. Accordingly, the low signal may activate the first transistor 505 and may deactivate the fifth transistor 515. Thus, the first gate line 525 and the second gate line 530 may couple with the first signal node 550. Additionally, because the fifth transistor 515 may be deactivated during the first access operation, the second gate line 530 may be isolated from the virtual ground node.

In some cases, as part of the first access operation, the first signal node 550 may be biased to a first voltage, which may bias the first gate line 525 and the second gate line 530 to the first voltage. Additionally or alternatively, as part of the first access operation, a bit line may be biased to a second voltage less than the first voltage (e.g., as part of the "select positive" operation as described with reference to FIG. 4). In an illustrative, non-limiting example, the bit line may be biased to a voltage of 3.6 volts (V), while the first gate line 525 and the second gate line 530 may be biased to a voltage of 5V or to a supply voltage, though one skilled in the art may appreciate that other combinations of voltages are possible.

Additionally or alternatively, as part of a second access operation to store a second value in a memory cell coupled with a pillar coupled with the first gate line 525 and the second gate line 530 (e.g., a selected pillar), the second signal node 540-a and the third signal node 540-b may apply a high signal (e.g., a logic "1", a high voltage) to the gate of the first transistor 505 and the gate of the fifth transistor 515. Accordingly, the high signal may deactivate the first transistor 505 and may activate the fifth transistor 515. Thus, the first gate line 525 and the second gate line 530 may couple with the virtual ground node (e.g., through the fifth transistor 515), which may bias the first gate line 525 and the second gate line 530 to the voltage of the virtual ground node (e.g., to 0V).

As part of the second access operation, the bit line may be biased to a negative voltage less than the voltage of the virtual ground node (e.g., as part of the "select negative" operation as described with reference to FIG. 4). In an illustrative, non-limiting example, the bit line may be biased to a voltage of negative 3.6 volts (V), while the first gate line 525 and the second gate line 530 may be biased to a voltage of 0V, though one skilled in the art may appreciate that other combinations of voltages are possible.

In some examples, while outside an access operation (e.g., while in an idle mode), the circuit 500-a may bias the first gate line 525 to a third voltage and may bias the second gate line 530 to a fourth voltage. For example, the third signal node 545 may activate the second transistor 510, which may pull up a voltage of the supply node 555 and accordingly bias the first gate line 525 to the third voltage. Additionally, the second signal node 540-a and the fourth signal node 540-b may respectively apply a high signal to the gate of the first transistor 505 and the gate of the fifth transistor 515, which may bias the second gate line 530 to the fourth voltage. In an illustrative, non-limiting example of the idle mode, the circuit 500-a may bias the first gate line 525 may to a voltage of negative 3.6V, and may bias the second gate line 530 may to a voltage of 0V. Further, during the idle mode, the bit line may be biased to a voltage of 0V, though one skilled in the art may appreciate that other combinations of voltages are possible.

In some cases, the circuit 500-a may include one or more inverters to bias the first gate line 525 and the second gate line 530. For example, the fifth transistor 515 may be replaced with an inverter coupled with the second gate line 530. In such examples, the second gate line 530 may not be coupled with (e.g., may be isolated from) the first transistor 505, the second transistor 510, the third transistor 520, and the fourth transistor 535. Additionally, an input of the inverter may be coupled with the third signal node 540-b, while an output of the inverter may be coupled with the second gate line 530. Accordingly, if the third signal node 540-b carries a high signal, then the inverter may bias the second gate line 530 to a low signal or low voltage. Alternatively, if the third signal node 540-b carries a low signal, then the inverter may bias the second gate line 530 to a high signal or high voltage.

Additionally or alternatively, the fifth transistor 515 may be replaced with a pair of inverters coupled with the first gate line 525 and the second gate line 530. In such examples, the first gate line 525 may be coupled with an input of a first inverter of the pair of the inverters. An output of the first inverter may be coupled with an input of a second inverter of the pair of inverter, while an output of the second inverter may be coupled with the second gate line 530. Accordingly, if the first gate line 525 is biased to a high voltage (e.g., using the first transistor 505, the second transistor 510, the third transistor 520, and the fourth transistor 535), the second gate line 530 may be biased to a high voltage. Alternatively, if the first gate line 525 is biased to a low voltage, the second gate line 530 may be biased to a low voltage.

Figure 5B:
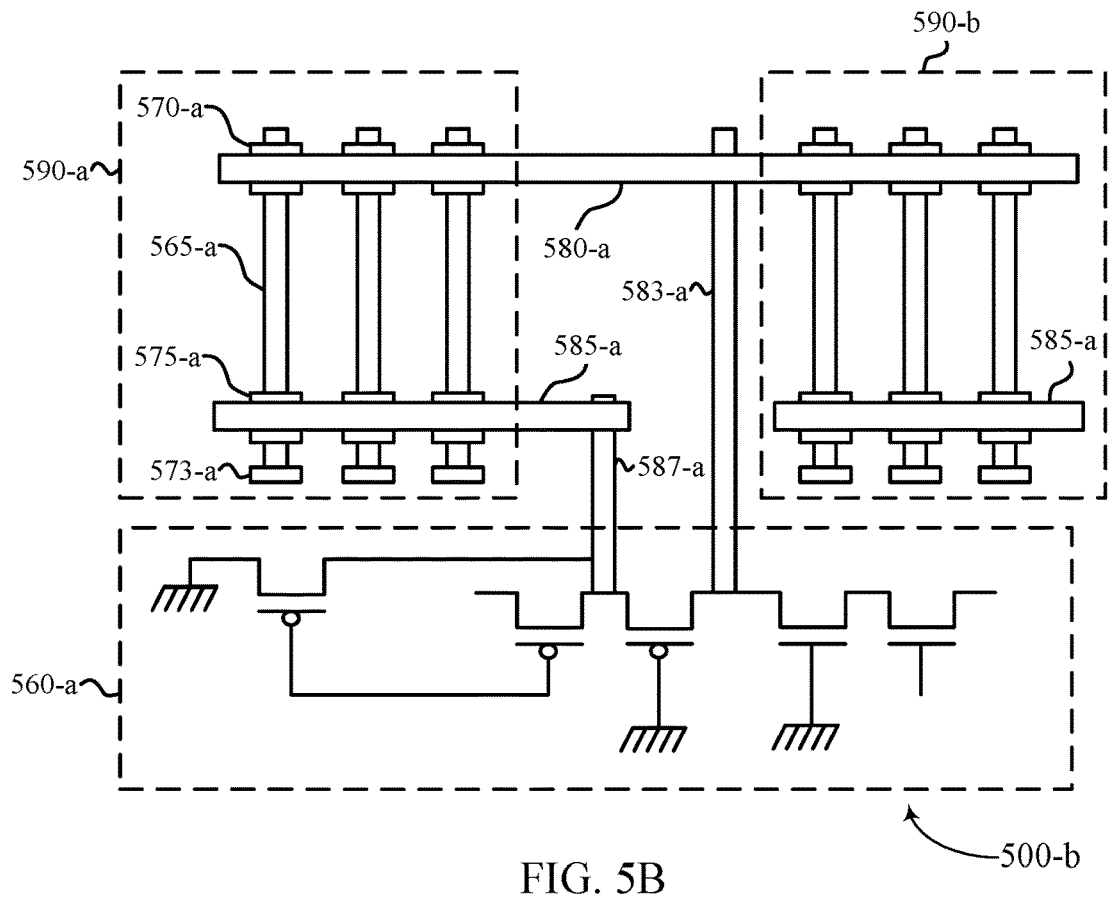

FIG. 5B illustrates an example of a memory array 500-b that supports shared decoder architecture for three-dimensional memory arrays in accordance with examples as disclosed herein. The memory array 500-b may include aspects of the memory array 400, the circuit 500-a or both. For example, the memory array 500-b may include a circuit 560-a, which may be an example of the circuit 500-a. Additionally, the memory array 500-b may include one or more vias, such as the via 565-a, selectively coupled with a first gate line 580-a and a second gate line 585-a. The via 565-a may be coupled with the first gate line 580-a and the second gate line 585-a using a first transistor 570-a and a second transistor 575-a. Additionally, the via 565-a may be coupled with a bit line 573-a. In some cases, the via 565-a, the bit line 573-a, the first transistor 570-a, the second transistor 575-a, the first gate line 580-a, the second gate line 585-a, or any combination thereof may be examples of the corresponding components as described with reference to FIGS. 3A, 3B, and 4. For example, the first transistor 570-a may be an example of the transistors 225-a and 410 and the second transistor 575-a may be an example of the transistors 225-b and 415 described with reference to FIGS. 3A, 3B, and 4.

The memory array 500-b may illustrate an example of positioning the circuit 560-a between a first set of vias 590-a and a second set of vias 590-b. In some examples, the first set of vias 590-a may be part of a first tile of the memory array 500-b, while the second set of vias 590-b may be part of a second tile of the memory array 500-b. Accordingly, the circuit 560-a may be positioned between tiles of the memory array 500-b. Additionally or alternatively, the first set of vias 590-a may be part of a first set of interleaving comb structures (e.g., a first set of word lines 205) of a first tile of the memory array 500-b, while the second set of vias 590-b may be part of a second set of interleaving comb structures of the first tile of the memory array 500-b. Accordingly, the circuit 560-a may be positioned between sets of interleaving comb structures of the memory array 500-b.

In some cases, the circuit 560-a may be coupled with the first gate line 580-a and the second gate line 585-a using respective vias 583-a and 587-a. The vias 583-a and 587-a may not be coupled with memory cells of the memory array 500-b, and may respectively couple directly with the first gate line 580-a and the second gate line 585-a (e.g., the vias 583-a and 587-a may be examples of placeholder conductive pillars or vias). In some cases, the vias 583-a and 587-a may be orthogonal to the first gate line 580-a and the second gate line 585-a. In some cases, the vias 583-a and 587-a may form or may be part of a wall of vias which may increase the complexity of coupling the circuit 560-a with the first gate line 580-a and the second gate line 585-a. For example, the wall of vias may interrupt the second gate line 585-a, as illustrated in FIG. 5B. Accordingly, the memory array 500-b may include additional circuitry to bias the second gate line 585-a (e.g., the portion of the second gate line 585-a coupled with the second set of vias 590-b), as described with greater detail with reference to FIGS. 7A, 7B, 7C, and 8.

Figure 5C:
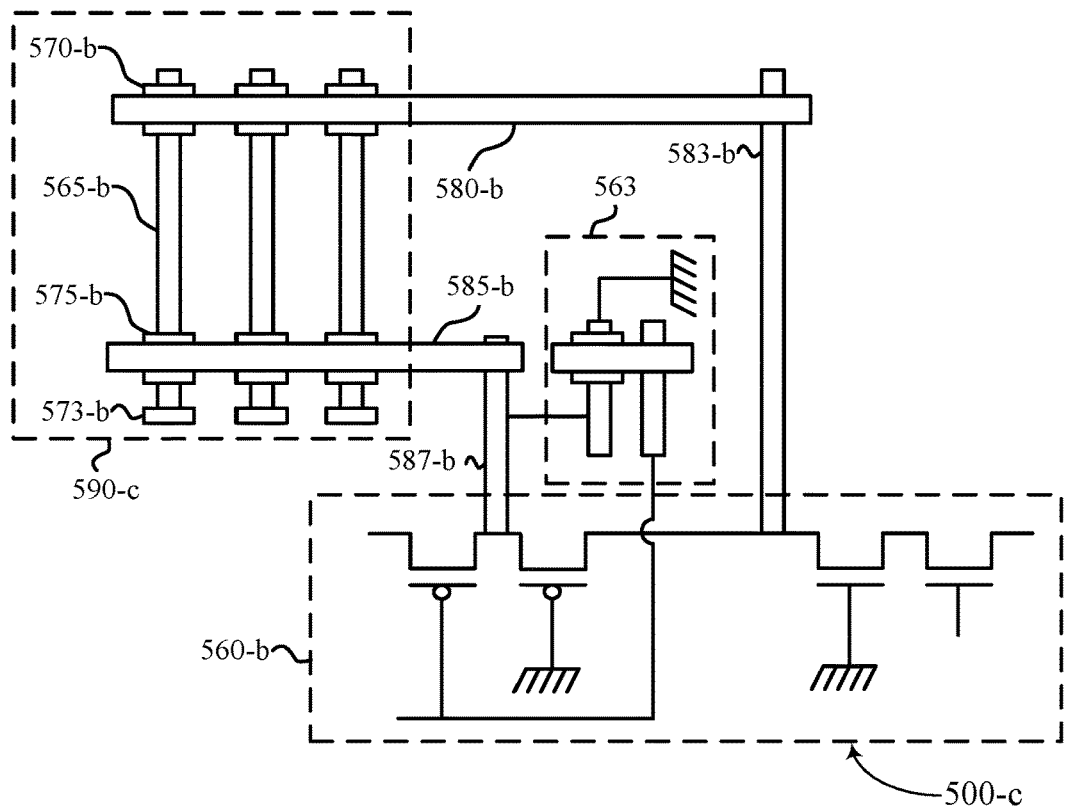

FIG. 5C illustrates an example of a memory array 500-c that supports shared decoder architecture for three-dimensional memory arrays in accordance with examples as disclosed herein. The memory array 500-c may include aspects of the memory array 400, the circuit 500-a, the memory array 500-b, or any combination thereof. For example, the memory array 500-c may include a circuit 560-b, which may be an example of the circuit 500-a. Additionally, the memory array 500-c may include one or more vias, such as the via 565-b, selectively coupled with a first gate line 580-b and a second gate line 585-b. The via 565-b may be coupled with the first gate line 580-b and the second gate line 585-b using a first transistor 570-b and a second transistor 575-b. Additionally, the via 565-a may be coupled with a bit line 573-a. In some cases, the via 565-b, the bit line 573-b, the first transistor 570-b, the second transistor 575-b, the first gate line 580-b, the second gate line 585-b, or any combination thereof may be examples of the corresponding components as described with reference to FIGS. 3A, 3B, and 4. For example, the first transistor 570-b may be an example of the transistors 225-a and 410 and the second transistor 575-b may be an example of the transistors 225-b and 415 described with reference to FIGS. 3A, 3B, and 4.

The memory array 500-c may illustrate an example of positioning the circuit 560-b at an end a set of vias 590-c. In some examples, the set of vias 590-c may be part of a tile of the memory array 500-c, such that the circuit 560-b may be positioned at an end of one or more tiles of the memory array 500-c. In some cases, the circuit 560-b may be coupled with the first gate line 580-b and the second gate line 585-b using respective vias 583-b and 587-b. The vias 583-a and 587-a may not be coupled with memory cells of the memory array 500-b (e.g., the vias 583-b and 587-b may be examples of placeholder conductive pillars or vias). In some cases, the vias 583-b and 587-b may be orthogonal to the first gate line 580-b and the second gate line 585-b, and may respectively couple directly with the first gate line 580-a and the second gate line 585-a.

In some cases, the memory array 500-c may include a circuit 563. The circuit 563 may be an example of the fifth transistor 515 as described with reference to FIG. 5A. For example, the circuit 563 may include a TFT coupled with a virtual ground node and the second via 587-b, as illustrated in FIG. 5C. In some cases, a gate of the TFT transistor may be coupled with the second signal node 540-a, as described with reference to FIG. 5A.

Figure 6A:
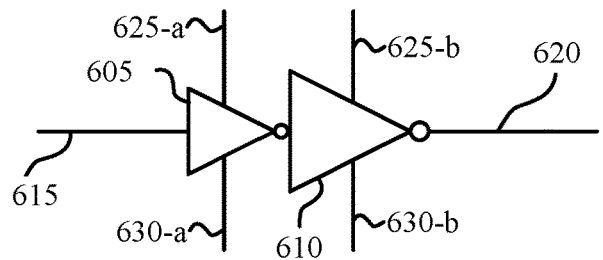
FIGS. 6A, 6B, and 6C illustrate examples of circuitry that supports shared decoder architecture for three-dimensional memory arrays in accordance with examples as disclosed herein.

FIG. 6A illustrates an example of a circuit 600-a that supports shared decoder architecture for three-dimensional memory arrays in accordance with examples as disclosed herein. The circuit 600 may be coupled with or may be an example of a decoder configured to bias a first gate line and the second gate line, such as the first gate line 425 and the second gate line 430 as described with reference to FIG. 4, to one or more voltages as part of an access operation. For example, the circuit 600 may bias the second gate line to a first voltage as part of a first access operation (e.g., to 5V, as part of a "select positive" operation as described with reference to FIG. 4) using the first gate line. Additionally, the circuit 600 may bias the second gate line to a second voltage less than the first voltage as part of a second access operation (e.g., to 0V, as part of a "select negative" operation as described with reference to FIG. 4) using the first gate line. In some examples, the circuit 600 may receive one or more input signals at one or more components of the circuit 600, which may determine or generate the voltages used for the access operations.

The circuit 600 may include a pair of inverters, such as a first inverter 605 and a second inverter 610, coupled with the first gate line and the second gate line. In such examples, the first gate line may be coupled with an input 615 of the first inverter 605 of the pair of the inverters. An output of the first inverter 605 may be coupled with an input of the second inverter 610, while an output 620 of the second inverter 610 may be coupled with the second gate line. Accordingly, the circuit 600 may bias the second gate line to a first voltage if the first gate line is biased to a high voltage (e.g., using the first transistor 505, the second transistor 510, the third transistor 520, and the fourth transistor 535). Alternatively, the circuit 600 may bias the second gate line to a second voltage if the first gate line is biased to a low voltage, as described in greater detail with reference to FIG. 6C.

In some cases, the inverters 605 and 610 may each include a set of supply nodes. For example, the inverter 605 may include a supply node 625-a and a supply node 630-a, while the second inverter 610 may include a supply node 625-b and a supply node 630-b. The voltage supplied to the supply nodes 625-a and 625-b (e.g., the high supply nodes) may correspond to the first voltage, while the voltage supplied to the supply nodes 630-a and 630-b (e.g., the low supply nodes) may correspond to the second voltage. Accordingly, the circuit 600 may output the first voltage if the input voltage (e.g., the voltage of the first gate line) is less than or equal to a threshold (e.g., less than or equal to the voltage supplied to the supply nodes 630-a and 630-b). Additionally or alternatively, the circuit 600 may output the second voltage if the input voltage exceeds the threshold.

Figure 6B:
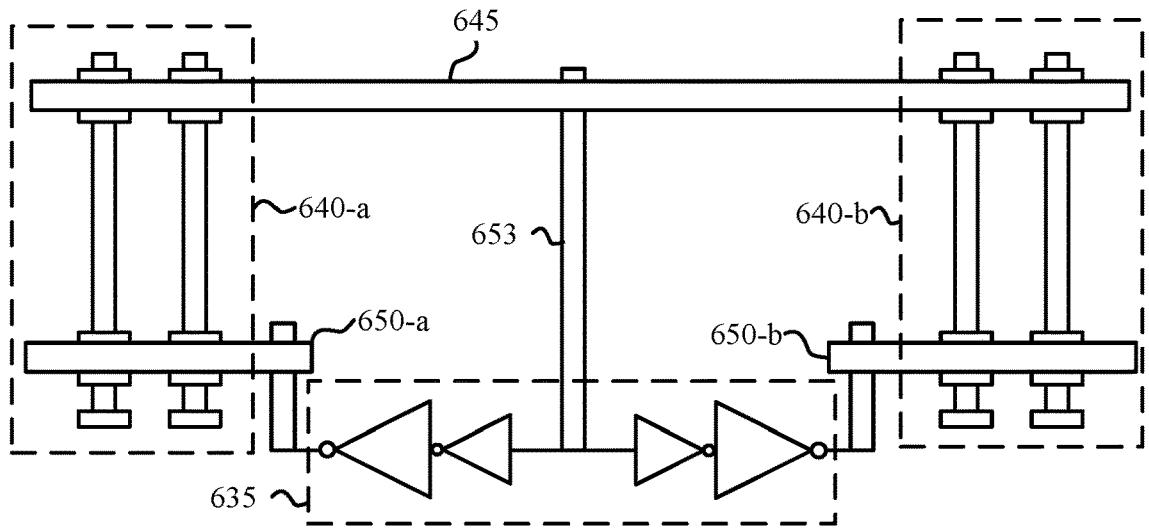

FIG. 6B illustrates an example of a memory array 601 that supports shared decoder architecture for three-dimensional memory arrays in accordance with examples as disclosed herein. The memory array 601 may include aspects of the memory array 400, the memory array 500-b, the memory array 500-c, the circuit 600, or any combination thereof. For example, the memory array 601 may include a circuit 635, which may be an example of the circuit 600. Additionally, the memory array 601 may include one or more sets of vias, such as the set of vias 640-a and 640-b, selectively coupled with a first gate line 645 and a second gate line 650. In some cases, the set of vias 640-a and 640-b, the first gate line 645, the second gate line 650, or any combination thereof may be examples of the corresponding components as described with reference to FIGS. 4, 5A, and 5B.

The memory array 601 may illustrate an example of positioning the circuit 635 between the first set of vias 640-a and the second set of vias 640-b. In some examples, the first set of vias 640-a may be part of a first tile of the memory array 601, while the second set of vias 640-b may be part of a second tile of the memory array 601. Accordingly, the circuit 635 may be positioned between tiles of the memory array 601. Additionally or alternatively, the first set of vias 640-a may be part of a first set of interleaving comb structures (e.g., a first set of word lines 205) of a first tile of the memory array 601, while the second set of vias 640-b may be part of a second set of interleaving comb structures of the first tile of the memory array 601. Accordingly, the circuit 635 may be positioned between sets of interleaving comb structures of the memory array 601.

In some cases, the circuit 635 may be coupled with the first gate line 645 using a via 653. The via 653 may not be coupled with memory cells of the memory array 601, and may couple with the first gate line 645. In some cases, the via 653 may form or may be part of a wall of vias which may increase the complexity of coupling the circuit 635 with the first gate line 645 and the second gate line 530. For example, the wall of vias may interrupt the second gate line 650, as illustrated in FIG. 5B, which may split the second gate line 650 into a first portion 650-a and a second portion 650-b.

Accordingly, the memory array 601 may include additional circuitry to bias the second gate line 650 (e.g., the first portion 650-a and the second portion 650-b). For example, the circuit 635 may include a second set of inverters (e.g., a third inverter and a fourth inverter), in addition to the first inverter 605 and the second inverter 610. In some examples, the first inverter 605 and the second inverter 610 may be configured to bias the first portion of the second gate line 650-a, while the third inverter and the fourth inverter may be configured to bias the second portion of the gate line 650-b. In some examples, the first portion of the gate line 650-a and the second portion of the gate line 650-b may be coupled with the circuit 635 using respective vias, as illustrated in FIG. 6B.

In some example, the first gate line 645 and the second gate line 650 may be biased using the same signal. For example, the gate line 645 may be biased by a circuit (not shown). The voltage on the gate line 645 may be conducted along via 653 to the circuit 635. The circuit 635 may include an input signal node, which may receive an input signal from the gate line 645 (e.g., using the via 653). Because the sets of inverters of the circuit 635 may be coupled with the input signal node, the input signal may route through the sets of inverters to bias the second gate line 650. Accordingly, the memory array 601 may be configured to bias the first gate line 645 and the second gate line 650 using a single signal.

In some example, the circuit 635 may bias the first gate line 645 and the second gate line 650 using the same signal. For example, the circuit 635 may include an input signal node, which may apply an input signal to the gate line 645 (e.g., using the via 653). Because the sets of inverters of the circuit 635 may be coupled with the input signal node, the input signal may route through the sets of inverters to bias the second gate line 650.

Figure 6C:
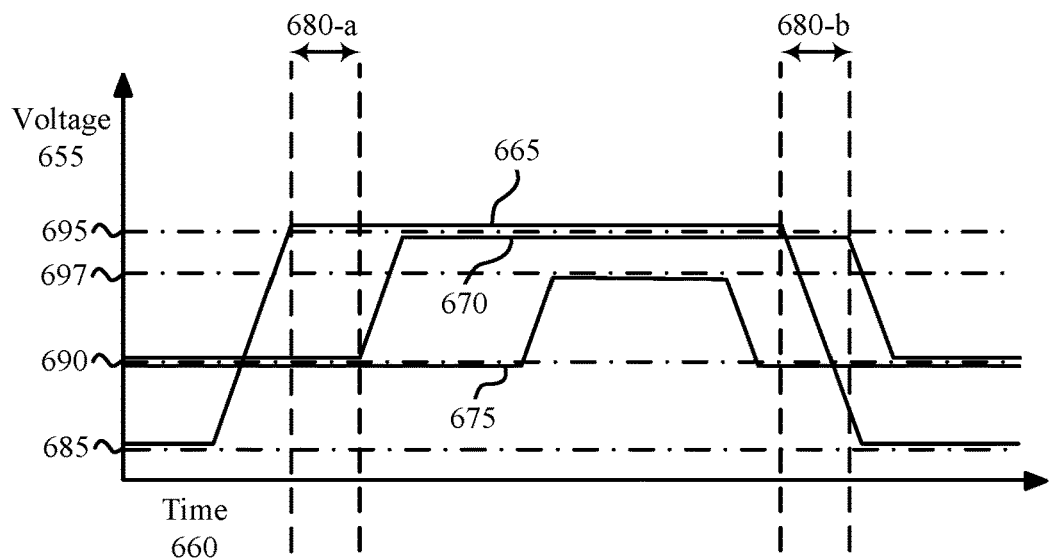

FIG. 6C illustrates an example of a timing diagram 602 that supports shared decoder architecture for three-dimensional memory arrays in accordance with examples as disclosed herein. The timing diagram 602 may illustrate the voltage 655 of components of the memory array 601 over time 660 during an access operation. For example, the timing diagram 602 may illustrate a voltage of a first gate line 665, a voltage of a second gate line 670, and a voltage of a bit line 675. In some cases, the first gate line, the second gate line, and the bit line may be examples of the corresponding components as described with reference to FIGS. 4 through 6B.

The timing diagram 602 may illustrate an example of a select positive operation (e.g., as described with reference to FIG. 4) for a memory array, such as the memory array 500-b, the memory array 500-c, or the memory array 601. Initially, the memory array may be in an idle mode. For example, a signal node may apply a first voltage 685 to the first gate line (e.g., a negative voltage, such as negative 3.6V). Because the second gate line may be coupled with the first gate line using a pair of inverters (e.g., as described with reference to FIGS. 6A and 6B), the first voltage may pass through the pair of inverters to bias the second gate line to a second voltage 690. (e.g., 0V).

As part of the select positive operation, the signal node may apply a third voltage 695 (e.g., a voltage higher than the second voltage 690, such as 5V) to the first gate line. Accordingly, the third voltage 695 may pass through the pair of inverters to bias the second gate line to the third voltage 695. In some cases, the part of inverters may act as a buffer or delay component. Thus, there may be a delay 680-a between the voltage of the first gate line 665 being biased to the third voltage 695 and the voltage of the second gate line 670 being biased to the third voltage 695.

In some cases, while the voltage of the first gate line 665 and the voltage of the second gate line 670 are biased to the third voltage 695, the voltage of the bit line 675 may be biased to a fourth voltage 697. In some cases, the fourth voltage 697 may be less than the third voltage 695 (e.g., the fourth voltage 697 may be 3.6V). Accordingly, the first gate line and the second gate line may activate respective transistors coupled with a via to couple the via with the bit line to access a memory cell (e.g., as described with reference to FIG. 4). In some cases, after accessing the memory cell, the signal node may remove the third voltage 695 from the first gate line and may apply the first voltage 685 to the first gate line. Accordingly, the voltage of the first gate line 665 may fall to the first voltage 685, and the voltage of the second gate line 670 may fall to the second voltage 690. Additionally, the voltage of the bit line 675 may return to the second voltage 690. In some cases, because the pair of inverters may act as a buffer, there may be a second delay 680-b between the fall of the voltage of the first gate line 665 and the fall of the voltage of the second gate line 670.

In some cases, to perform a select negative operation, the signal node may apply the second voltage 690 to the first gate line (e.g., instead of the third voltage 695, as in the select positive operation). Accordingly, the voltage of the first gate line 665 may rise to the second voltage 690, while the voltage of the second gate line 670 may remain at the second voltage 690. In some cases, while the first gate line is biased to the second voltage 690, the bit line may be biased to a fifth voltage. The fifth voltage may be lower than the second voltage 690 (e.g., the fifth voltage may be approximately negative 3.6V). Accordingly, the first gate line and the second gate line may activate respective transistors coupled with a via to couple the via with the bit line to access a memory cell (e.g., as described with reference to FIG. 4).

Figure 7A:
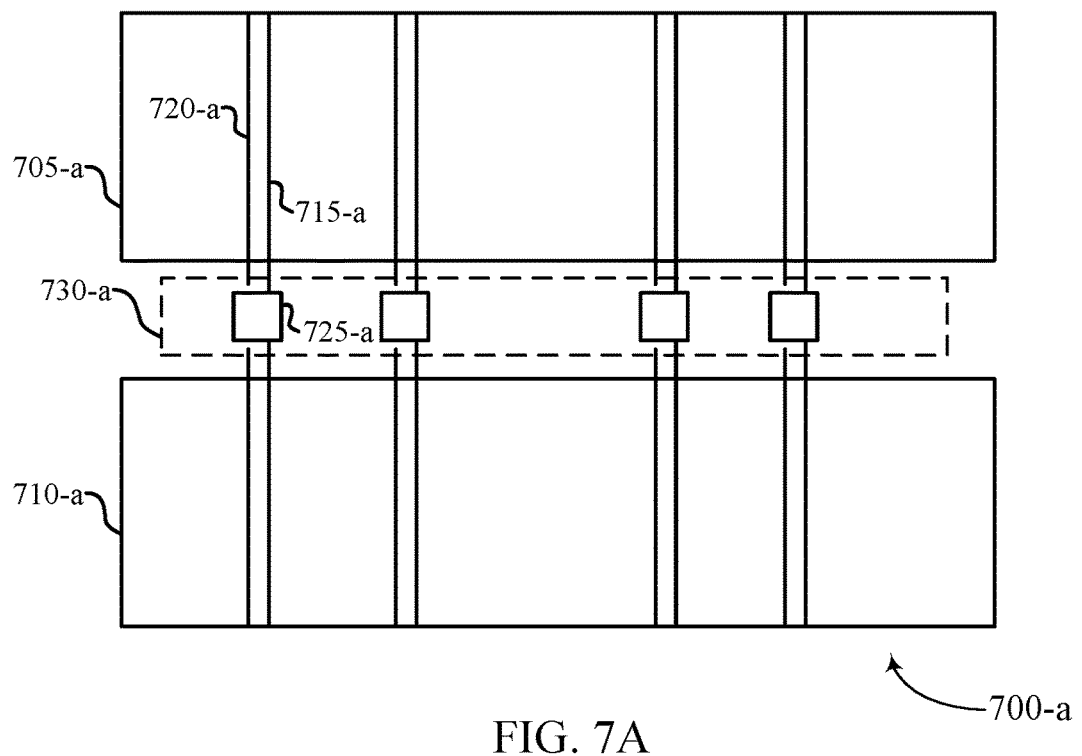
FIGS. 7A, 7B, 7C, and 7D illustrate examples of memory tiles that supports shared decoder architecture for three-dimensional memory arrays in accordance with examples as disclosed herein.

FIG. 7A illustrates an example of a memory array 700-a that supports shared decoder architecture for three-dimensional memory arrays in accordance with examples as disclosed herein. The memory array 700-a may include a first tile 705-a and a second tile 710-a. The first tile 705-a and the second tile 710-a may each include aspects and components of the memory array 400, as described with reference to FIG. 4. For example, the first tile 705-a and the second tile 710-a may include one or more vias extending through a set of levels of the memory array 700-a, the vias selectively coupling respective memory cells to respective bit lines. In some cases, each via may be coupled with a respective pillar using a first transistor and a second transistor, where a gate of the first transistor is coupled with a first gate line, such as the first gate line 715-a, and a gate of the second transistor is coupled with a second gate line, such as the second gate line 720-a.

The memory array 700-a may include one or more circuits to bias the first gate line 715-a and the second gate line 720-a as part of an access operation, such as the circuit 725-a, positioned between the first tile 705-a and the second tile 710-a. For example, the circuit 725-a may be positioned at an edge of the first tile 705-*a* adjoining an edge of the second tile 710-*a*. The circuit 725-*a* may include aspects of or may be an example of the circuit 500-*a*, the circuit 600, or a combination thereof. In some cases, positioning the circuit 725-*a* between tiles may allow for increased speed of an access operation compared to other configurations, for example by mitigating the distance between an accessed memory cell and the circuit 725-*a*. However, positioning the circuit 725-*a* between the first tile 705-*a* and the second tile 710-*a* may increase the complexity of coupling the first gate line 715-*a* and the second gate line 720-*a* with the circuit 725-*a*. For example, each circuit 725-*a* of the one or more circuits, may include a via coupled with the first gate line 715-*a*, for example as described with reference to FIGS. 5B, 5C, and 6B. In such examples, the vias may form a wall of vias 730-*a*, which may interrupt the second gate line 720-*a* (e.g., may split the second gate line 720-*a* into two portions), as illustrated in FIG. 7A. Accordingly, the circuit 725-*a* may include additionally circuitry to bias both portions of the second gate line 720-*a*, such as a first set of inverters to bias a first portion of the second gate line 720-*a* and a second set of inverters to bias the second portion of the second gate line 720-*a*, as described with reference to FIG. 6B.

Figure 7B:
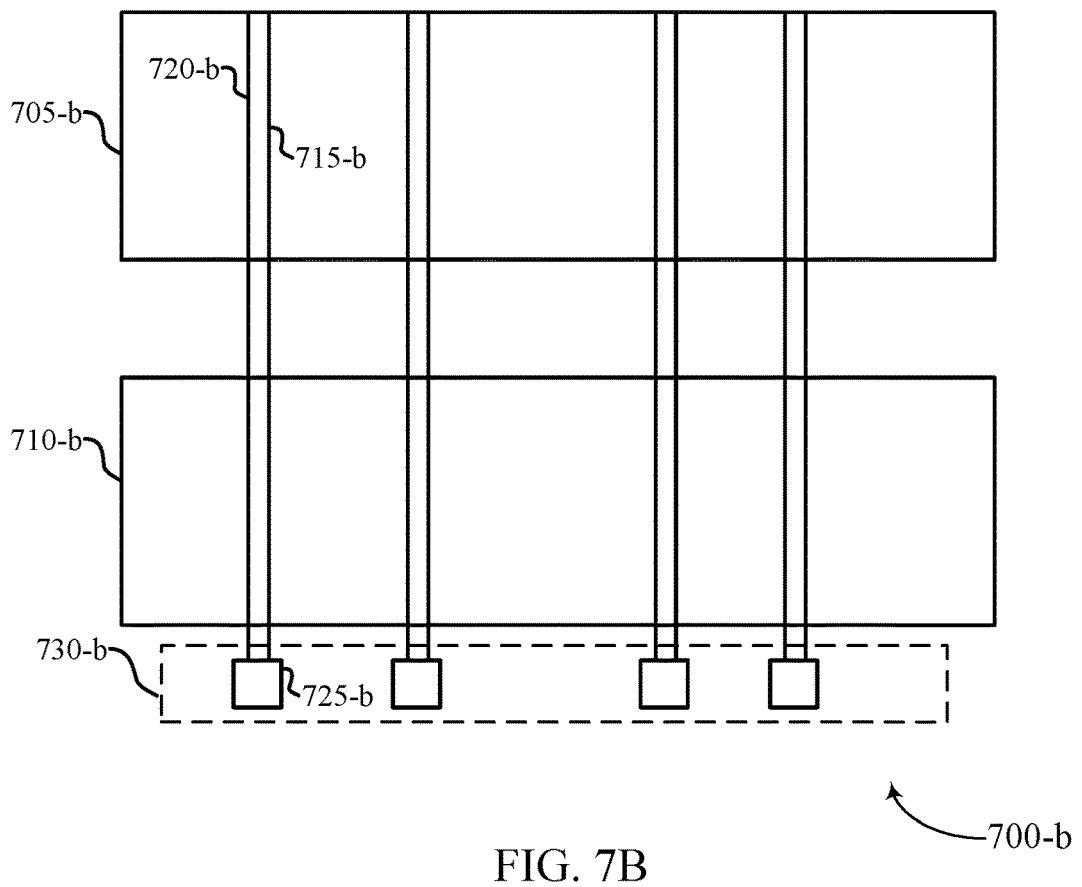

FIG. 7B illustrates an example of a memory array 700-*b* that supports shared decoder architecture for three-dimensional memory arrays in accordance with examples as disclosed herein. The memory array 700-*b* may include a first tile 705-*b* and a second tile 710-*b*. The first tile 705-*a* and the second tile 710-*b* may each include aspects and components of the memory array 400, as described with reference to FIG. 4. For example, the first tile 705-*b* and the second tile 710-*b* may include one or more vias extending through a set of levels of the memory array 700-*b*, the vias selectively coupling respective memory cells to respective bit lines. In some cases, each via may be coupled with a respective pillar using a first transistor and a second transistor, where a gate of the first transistor is coupled with a first gate line, such as the first gate line 715-*b*, and a gate of the second transistor is coupled with a second gate line, such as the second gate line 720-*b*.

The memory array 700-*b* may include one or more circuits to bias the first gate line 715-*b* and the second gate line 720-*b* as part of an access operation, such as the circuit 725-*b*, positioned at an end of the first tile 705-*b* and the second tile 710-*b* (e.g., rather than between the first tile and the second tile, as illustrated in FIG. 7A). For example, the circuit 725-*b* may be positioned at an edge of the first tile 705-*b* that does not adjoin an edge of the second tile 710-*b*. Additionally or alternatively, the circuit 725-*b* may be positioned at a first edge of the first tile 705-*b* opposite a second edge of the first tile 705-*b* adjoining an edge of the second tile 710-*b*. Additionally or alternatively The circuit 725-*b* may include aspects of or may be an example of the circuit 500-*a*, the circuit 600, or a combination thereof. In some cases, positioning the circuit 725-*b* at the end of the first tile 705-*b* and the second tile 710-*b* may allow the circuit 725-*b* to couple with the first gate line 715-*b* and the second gate line 720-*b* without interrupting the second gate line 720-*b* with the associated wall of vias 730-*b*. In some examples, positioning the circuit 725-*b* at the end of the first tile 705-*b* and the second tile 710-*b* may increase the length of the first gate line 715-*b* and the second gate line 720-*b*. However, the circuit 725-*b* may be configured to bias the relatively longer first gate line 715-*a* and second gate line 720-*b* without a significant decrease in the speed or performance of an access operation.

Figure 7C:
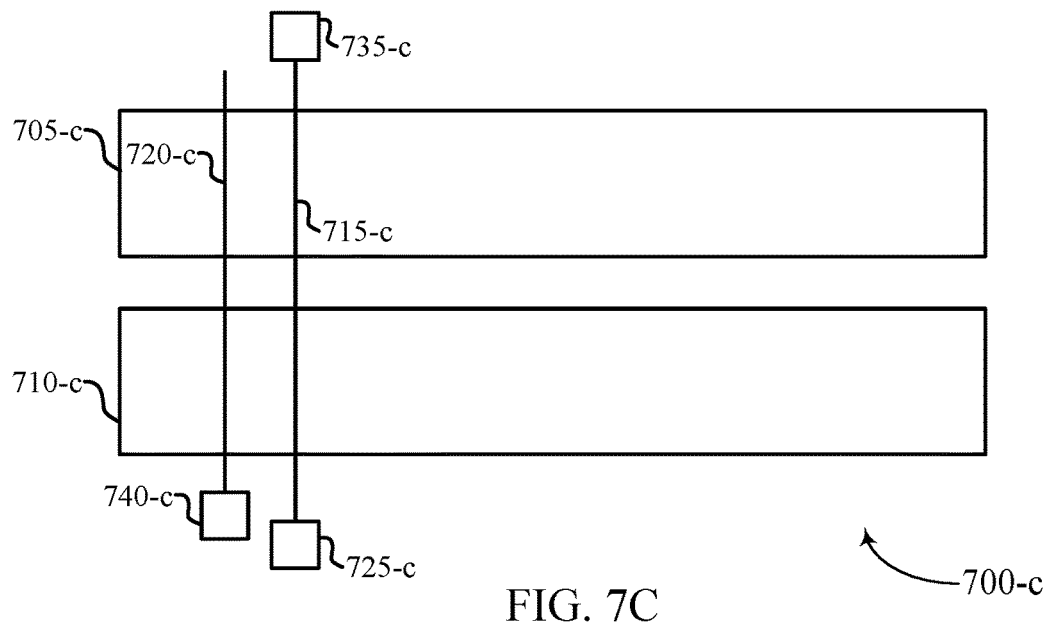

FIG. 7C illustrates an example of a memory array 700-*c* that supports shared decoder architecture for three-dimensional memory arrays in accordance with examples as disclosed herein. The memory array 700-*c* may include a first tile 705-*c* and a second tile 710-*c*. The first tile 705-*c* and the second tile 710-*c* may each include aspects and components of the memory array 400, as described with reference to FIG. 4. For example, the first tile 705-*c* and the second tile 710-*c* may include one or more pillars extending through a set of levels of the memory array 700-*c*, the pillars selectively coupling respective memory cells to respective bit lines. In some cases, each pillar may be coupled with a respective via using a first transistor and a second transistor, where a gate of the first transistor is coupled with a first gate line, such as the first gate line 715-*c*, and a gate of the second transistor is coupled with a second gate line, such as the second gate line 720-*c*.

The memory array 700-*c* may include one or more circuits to bias the first gate line 715-*c* and the second gate line 720-*c* as part of an access operation, such as the circuit 725-*c*, the circuit 735-*c*, and the circuit 740-*c*. In some examples, the circuit 725-*c* may be coupled with the first gate line 715-*c*, and may include one or more transistors to bias the first gate line 715-*c* to a first voltage, such as the transistor 505, the transistor 520, or both as described with reference to FIG. 5A (e.g., the "pull up" transistors). The circuit 735-*c* may be coupled with the first gate line 715-*c*, and may include one or more transistors to bias the first gate line 715-*c* to a second voltage, such as the transistor 510, the transistor 535, or both as described with reference to FIG. 5A (e.g., the "pull down" transistors) The circuit 740-*c* may be coupled with the second gate line 720-*c*, and may include circuitry to bias the second gate line, such as the transistor 515 or one or more inverters, as described with reference to FIG. 5A. In some cases, the circuit 725-*c* and the circuit 740-*c* may be positioned at a first end of the first tile 705-*c* and the second tile 710-*c*, while the circuit 735-*c* may be positioned at a second end of the first tile 705-*c* and the second tile 710-*c* opposite the first end.

Figure 7D:
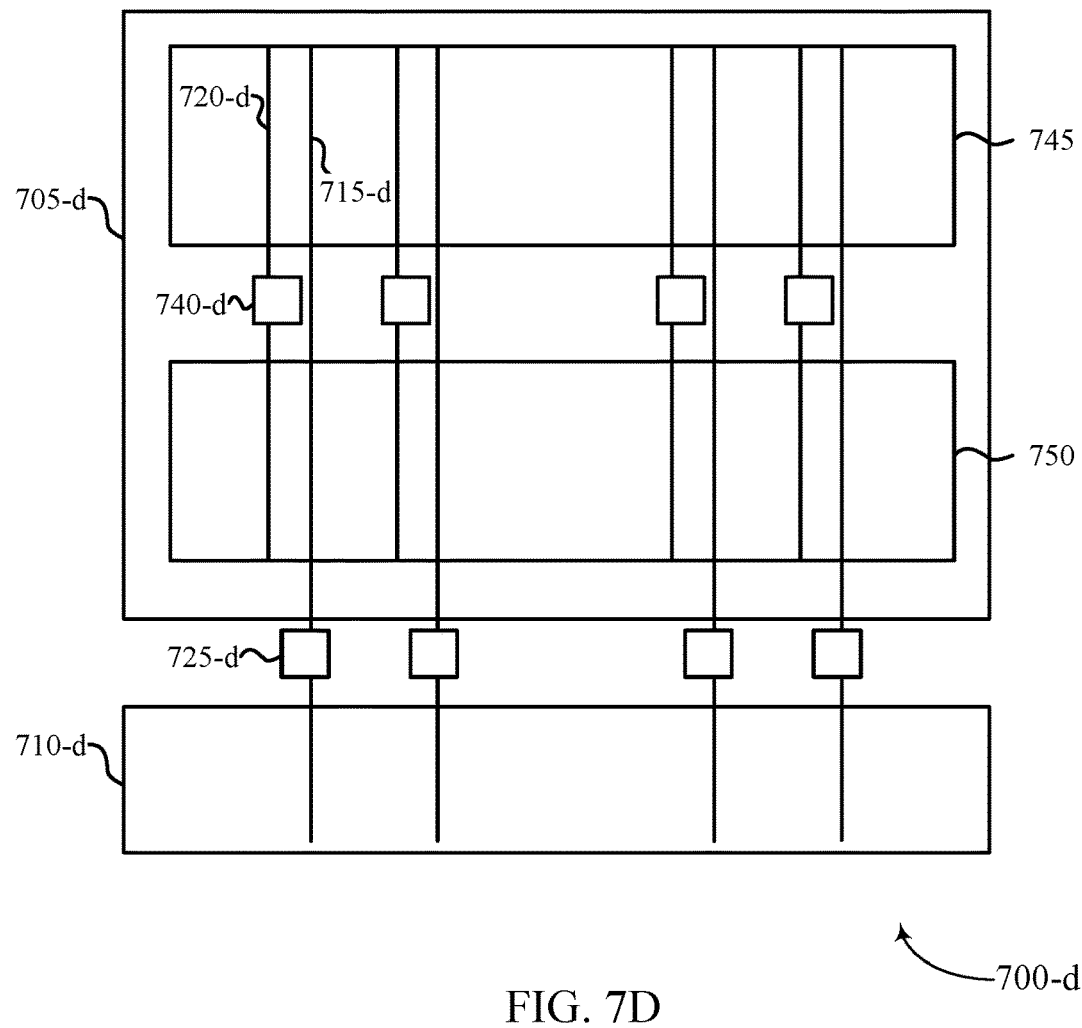

FIG. 7D illustrates an example of a memory array 700-*d* that supports shared decoder architecture for three-dimensional memory arrays in accordance with examples as disclosed herein. The memory array 700-*d* may include a first tile 705-*d* and a second tile 710-*d*. The first tile 705-*d* and the second tile 710-*d* may each include aspects and components of the memory array 400, as described with reference to FIG. 4. For example, the first tile 705-*d* and the second tile 710-*d* may include one or more pillars extending through a set of levels of the memory array 700-*d*, the pillars selectively coupling respective memory cells to respective bit lines. In some cases, each pillar may be coupled with a respective via using a first transistor and a second transistor, where a gate of the first transistor is coupled with a first gate line, such as the first gate line 715-*d*, and a gate of the second transistor is coupled with a second gate line, such as the second gate line 720-*d*.

Additionally, the first tile 705-*d* and the second tile 710-*d* may include one or more sets of interleaved comb structures, such as a first interleaved comb structure 745 and a second interleaved comb structure 750, coupled with respective sets of pillars. Each interleaved comb structure may include a first set of word lines and a second set of word lines (e.g., an even word line and an odd word line). In some examples, the first tile 705-*d* may include one or more placeholder vias (e.g., vias which are not coupled with a memory cell, as described with reference to FIGS. 5B, 5C, and 6B) between the first interleaved comb structure 745 and the second interleaved comb structure 750. In such examples, the memory array 700-*d* may include one or more circuits which utilize the placeholder vias, placeholder vias between the first tile 705-*d* and 710-*d*, or both to bias the first gate line 715-*d* and the second gate line 720-*d* as part of an access operation.

An interleaved comb structure for word lines (or other access lines) is shown and described with reference to the even word line 205-*a*-32 and the odd word line 205-*a*-31 of FIG. 2. The even word line 205-*a*-32 includes a first plurality of conductive lines extending into the array of memory cells and coupled with a plurality of memory cells. The first plurality of conductive lines are coupled with a common conductive line configured to drive the first plurality of conductive lines. The odd word line 205-*a*-31 includes a second plurality of conductive lines extending into the array of memory cells and coupled with the plurality of memory cells. The second plurality of conductive lines are coupled with a common conductive line configured to drive the second plurality of conductive lines. The first plurality of conductive lines are interleaved (e.g. inter-digitated) with the second plurality of conductive lines such that every other word line in the memory device is an even word line 205-*a*-32 and the other word lines are the odd word line 205-*a*-31.

The first interleaved comb structure 745 includes an even word line and its corresponding first plurality of conductive lines interleaved with a corresponding second plurality of conductive lines of an odd word line. A single even word line may be an example of a first plurality of conductive lines coupled with a single common conductive line and all conductive lines being biased by a single driver. Similarly, a single odd word line may be an example of a second plurality of conductive lines coupled with a single common conductive line and all conductive lines being biased by a single driver. A single interleaved comb structure may be an example a single even word line interleaved with a single odd word line. Thus, the first interleaved comb structure 745 may include a first even word line interleaved with a first odd word line and the second interleaved comb structure 750 may include a second even word line interleaved with a second odd word line.

For example, the memory array 700-*d* may include a circuit 725-*d* coupled with the first gate line 715-*d*. In some cases, the circuit 725-*d* may include aspects of the circuit 500-*a*, such as the transistor 505, the transistor 510, the transistor 520, the transistor 535, or any combination thereof. Accordingly, the circuit 725-*d* may be configured to bias the first gate line 715-*d* to one or more voltages as part of an access operation. In some cases, the circuit 725-*d* may be positioned between the first tile 705-*d* and 710-*d*, as illustrated in FIG. 7D. Additionally or alternatively, the circuit 725-*d* may be positioned between the first interleaved comb structure 745 and the second interleaved comb structure 750.

The memory array 700-*d* may further include a circuit 740-*d* coupled with the second gate line 720-*d*. In some cases, the circuit 740-*d* may include aspects of the circuit 500-*a*, such as the transistor 515 or a single inverter as described with reference to FIG. 5A.

Additionally or alternatively, the circuit 700-*d* may include aspects of the circuit 600. The circuit 725-*d* may be used to bias the first gate line 715-*d* using a circuit positioned between tiles. The position of the circuit 725-*d* in-between the tiles (e.g., tiles 705-*d* and 710-*d*) may be used so that the vias that couple the first gate lines 715-*d* with the circuits 725-*d* without disrupting other aspects of the memory device. The circuit 740-*d* may be an example of the circuit 601, such as the first inverter 605 and the second inverter 610 as described with reference to FIGS. 6A and 6B. Accordingly, the circuit 740-*d* may be coupled with the first gate line 715-*d* using a via (e.g., via 653). In response to the circuit 725-*d* biasing the first gate line 715-*d*, the circuit 740-*d* may receive the signal and may drive a modified signal on the second gate line 720-*d*. For example, the circuit 740-*d* may use the invertors to modify the signal received over the first gate line 715-*d* to bias the second gate line 720-*d*. In some cases, the circuit 740-*d* may be positioned between the first interleaved comb structure 745 and the second interleaved comb structure 750 associated with word lines of the memory device. Additionally or alternatively, the circuit 725-*d* may be positioned between the first tile 705-*d* and 710-*d*.

Figure 8:
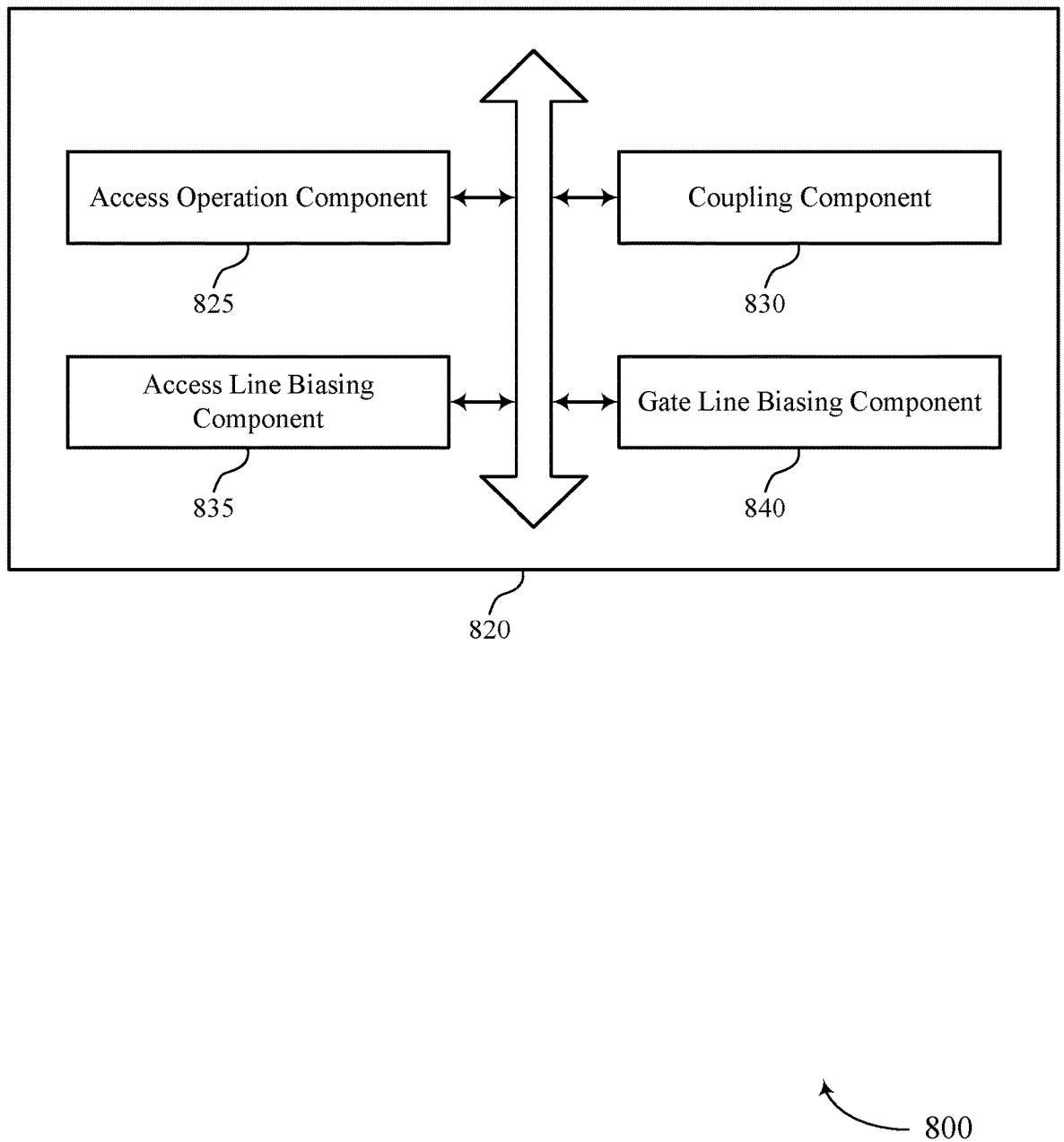
FIG. 8 shows a block diagram of a memory device that supports shared decoder architecture for three-dimensional memory arrays in accordance with examples as disclosed herein.

FIG. 8 shows a block diagram 800 of a memory device 820 that supports shared decoder architecture for three-dimensional memory arrays in accordance with examples as disclosed herein. The memory device 820 may be an example of aspects of a memory device as described with reference to FIGS. 1 through 7D. The memory device 820, or various components thereof, may be an example of means for performing various aspects of shared decoder architecture for three-dimensional memory arrays as described herein. For example, the memory device 820 may include an access operation component 825, a coupling component 830, an access line biasing component 835, a gate line biasing component 840, or any combination thereof. Each of these components may communicate, directly or indirectly, with one another (e.g., via one or more buses).

The access operation component 825 may be configured as or otherwise support a means for performing an access operation for a memory cell that is coupled with a word line and a pillar extending through a plurality of levels of a memory array. The coupling component 830 may be configured as or otherwise support a means for coupling the pillar with a bit line by biasing a first gate line and a second gate line to a first voltage based at least in part on applying a first signal to a first transistor coupled with the first gate line and a first signal node and on applying a second signal to a second transistor coupled with a supply node and the first gate line. The access line biasing component 835 may be configured as or otherwise support a means for biasing the bit line to a second voltage based at least in part on coupling the pillar with the bit line.

In some examples, biasing the second gate line to the first voltage is further based at least in part on applying the first signal to a third transistor coupled with the second gate line and a virtual ground node.

In some examples, applying the first signal to the first transistor and the third transistor is based at least in part on applying, via a second signal node, the first signal to a gate of the first transistor and a gate of the third transistor.

In some examples, applying the second signal to the second transistor is based at least in part on applying, via a third signal node, the second signal to a gate of the second transistor.

In some examples, the access operation component 825 may be configured as or otherwise support a means for performing a second access operation for the memory cell. In some examples, the coupling component 830 may be configured as or otherwise support a means for coupling the pillar with the bit line by biasing the first gate line and the second gate line to a third voltage based at least in part on applying a third signal to the first transistor and applying a fourth signal to the second transistor, where the third voltage is less than the first voltage. In some examples, the access line biasing component 835 may be configured as or otherwise support a means for biasing the bit line to a fourth voltage based at least in part on biasing the first gate line and the second gate line to the third voltage, where the fourth voltage is less than the third voltage.

In some examples, the gate line biasing component 840 may be configured as or otherwise support a means for coupling the second gate line with the virtual ground node based at least in part on applying the third signal to the third transistor, where biasing the first gate line and the second gate line to the third voltage is based at least in part on applying the third signal.

In some examples, the gate line biasing component 840 may be configured as or otherwise support a means for coupling the first gate line with the first signal node based at least in part on applying the first signal to the first transistor, where biasing the first gate line and the second gate line to the first voltage as based at least in part on applying a third signal to the first signal node.

Figure 9:
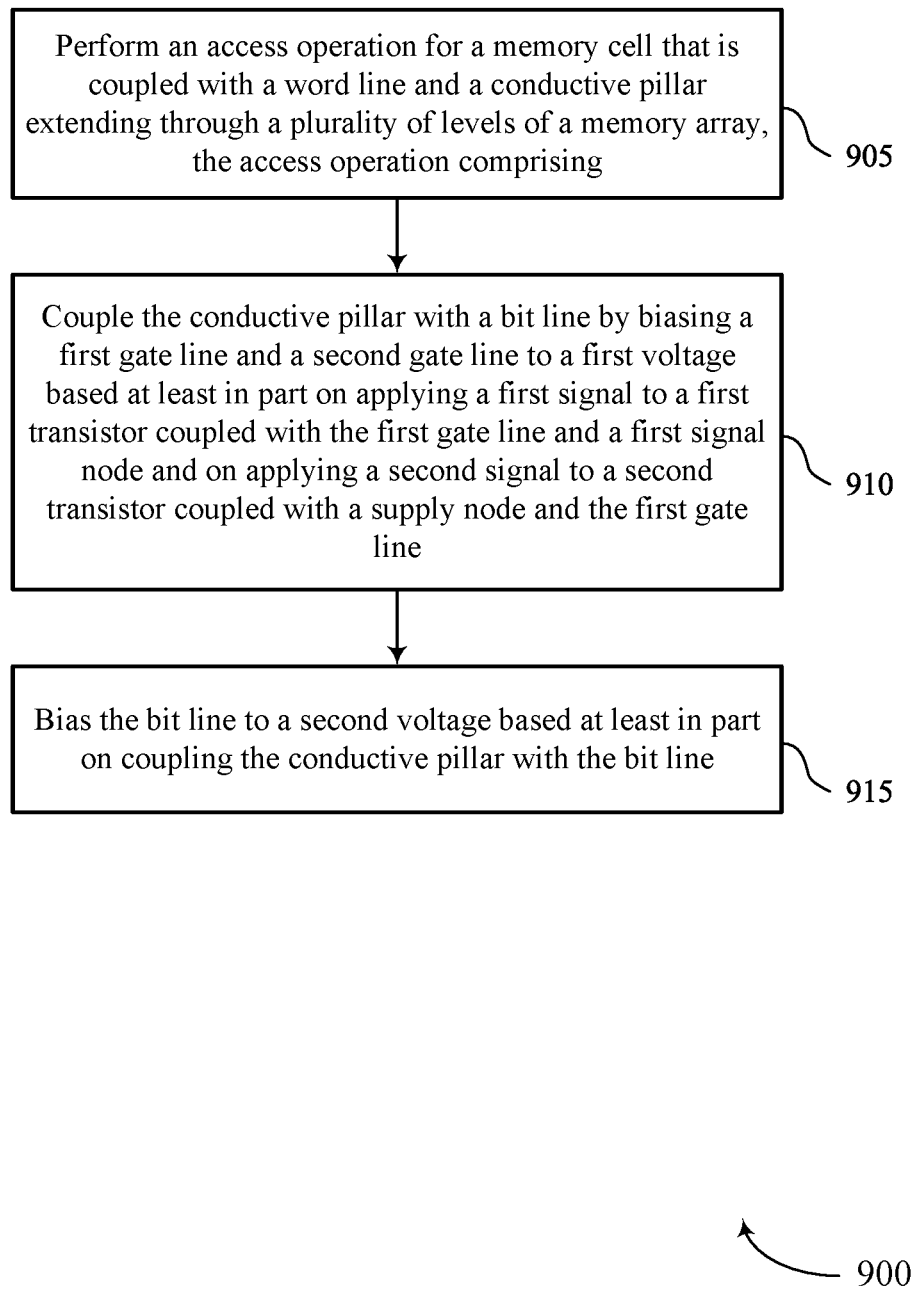
FIG. 9 shows a flowchart illustrating a method or methods that support shared decoder architecture for three-dimensional memory arrays in accordance with examples as disclosed herein.

FIG. 9 shows a flowchart illustrating a method 900 that supports shared decoder architecture for three-dimensional memory arrays in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include performing an access operation for a memory cell that is coupled with a word line and a pillar extending through a plurality of levels of a memory array. The operations of 905 may be performed in accordance with examples as disclosed herein. In some examples, aspects of the operations of 905 may be performed by an access operation component 825 as described with reference to FIG. 8.

At 910, the method may include coupling the pillar with a bit line by biasing a first gate line and a second gate line to a first voltage based at least in part on applying a first signal to a first transistor coupled with the first gate line and a first signal node and on applying a second signal to a second transistor coupled with a supply node and the first gate line. The operations of 910 may be performed in accordance with examples as disclosed herein. In some examples, aspects of the operations of 910 may be performed by a coupling component 830 as described with reference to FIG. 8.

At 915, the method may include biasing the bit line to a second voltage based at least in part on coupling the pillar with the bit line. The operations of 915 may be performed in accordance with examples as disclosed herein. In some examples, aspects of the operations of 915 may be performed by an access line biasing component 835 as described with reference to FIG. 8.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing an access operation for a memory cell that is coupled with a word line and a pillar extending through a plurality of levels of a memory array, the access operation including; coupling the pillar with a bit line by biasing a first gate line and a second gate line to a first voltage based at least in part on applying a first signal to a first transistor coupled with the first gate line and a first signal node and on applying a second signal to a second transistor coupled with a supply node and the first gate line; and biasing the bit line to a second voltage based at least in part on coupling the pillar with the bit line.

Aspect 2: The method, apparatus, or non-transitory computer-readable medium of aspect 1 where biasing the second gate line to the first voltage is further based at least in part on applying the first signal to a third transistor coupled with the second gate line and a virtual ground node.

Aspect 3: The method, apparatus, or non-transitory computer-readable medium of aspect 2 where applying the first signal to the first transistor and the third transistor is based at least in part on applying, via a second signal node, the first signal to a gate of the first transistor and a gate of the third transistor.

Aspect 4: The method, apparatus, or non-transitory computer-readable medium of aspect 3 where applying the second signal to the second transistor is based at least in part on applying, via a third signal node, the second signal to a gate of the second transistor.

Aspect 5: The method, apparatus, or non-transitory computer-readable medium of any of aspects 2 through 4, further including operations, features, circuitry, logic, means, or instructions, or any combination thereof for performing a second access operation for the memory cell, the second access operation including; coupling the pillar with the bit line by biasing the first gate line and the second gate line to a third voltage based at least in part on applying a third signal to the first transistor and applying a fourth signal to the second transistor, where the third voltage is less than the first voltage; and biasing the bit line to a fourth voltage based at least in part on biasing the first gate line and the second gate line to the third voltage, where the fourth voltage is less than the third voltage.

Aspect 6: The method, apparatus, or non-transitory computer-readable medium of aspect 5, further including operations, features, circuitry, logic, means, or instructions, or any combination thereof for coupling the second gate line with the virtual ground node based at least in part on applying the third signal to the third transistor, where biasing the first gate line and the second gate line to the third voltage is based at least in part on applying the third signal.

Aspect 7: The method, apparatus, or non-transitory computer-readable medium of any of aspects 1 through 6, further including operations, features, circuitry, logic, means, or instructions, or any combination thereof for coupling the first gate line with the first signal node based at least in part on applying the first signal to the first transistor, where biasing the first gate line and the second gate line to the first voltage as based at least in part on applying a third signal to the first signal node.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: An apparatus, including: a pillar extending through a plurality of levels of a memory array, where, at each level of the plurality of levels, one or more memory cells of the memory array are coupled with the pillar and a respective word line; a bit line; a first transistor and a second transistor in a series configuration with the first transistor, the first transistor and the second transistor configured to selectively couple the bit line with the pillar; a first gate line coupled with the first transistor; a second gate line coupled with the second transistor; a circuit coupled with the first gate line and the second gate line, the circuit including: a third transistor coupled with the first gate line and a first signal node; and a fourth transistor coupled with a supply node and the first gate line; and a decoder coupled with the circuit and configured to activate and deactivate the third transistor and the fourth transistor.

Aspect 9: The apparatus of aspect 8, where the circuit further includes: a fifth transistor positioned between the second gate line and a virtual ground node, where a gate of the third transistor and a gate of the fifth transistor are coupled with a second signal node.

Aspect 10: The apparatus of aspect 9, further including: a first tile including the pillar and a second tile including a second pillar extending through the plurality of levels of the memory array, the first tile adjoining the second tile at a first edge of the first tile, where locations of the third transistor, the fourth transistor, and the fifth transistor are associated with a second edge of the first tile opposite the first edge.

Aspect 11: The apparatus of any of aspects 9 through 10, further including: a first tile including the pillar and a second tile including a second pillar extending through the plurality of levels of the memory array, the first tile adjoining the second tile at a first edge of the first tile and a first edge of the second tile, where locations of the third transistor, the fourth transistor, and the fifth transistor are associated with the first edge of the first tile and the first edge of the second tile.

Aspect 12: The apparatus of any of aspects 9 through 11, further including: a first tile including the pillar and a second tile including a second pillar extending through the plurality of levels of the memory array, the first tile adjoining the second tile at a first edge of the first tile and a first edge of the second tile, where locations of the third transistor and the fifth transistor are associated with a second edge of the first tile opposite the first edge of the first tile and a location of the fourth transistor is associated with a second edge of the second tile opposite the first edge of the second tile.

Aspect 13: The apparatus of any of aspects 9 through 12, where the second gate line is coupled with the third transistor and the first gate line.

Aspect 14: The apparatus of any of aspects 9 through 13, where the fourth transistor and the fifth transistor are n-mos transistors and the third transistor is a p-mos transistor.

Aspect 15: The apparatus of any of aspects 9 through 14, where a gate of the third transistor and a gate of the fifth transistor are coupled with a third signal node and a gate of the fourth transistor is coupled with a fourth signal node.

Aspect 16: The apparatus of any of aspects 8 through 15, where: the first gate line includes a first conductive line coupled with a plurality of first transistors and a first via that extends orthogonal to the first conductive line, the first via coupling the first conductive line with the circuit; and the second gate line includes a second conductive line coupled with a plurality of second transistors and a second via that extends orthogonal to the first conductive line, the second via coupling the second conductive line with the circuit.

Aspect 17: The apparatus of any of aspects 8 through 16, where the circuit further includes: an inverter coupled with the second gate line, where a gate of the third transistor and an input of the inverter are coupled with a second signal node.

Aspect 18: The apparatus of any of aspects 8 through 17, where the circuit further includes: a fifth transistor coupled with the first gate line and the second gate line; and a sixth transistor coupled with the fourth transistor and the first gate line, where a gate of the fifth transistor and a gate of the sixth transistor are coupled with a virtual ground node.

Aspect 19: The apparatus of aspect 18, where the fifth transistor is a p-mos transistor and the sixth transistor is an n-mos transistor.

Aspect 20: The apparatus of any of aspects 8 through 19, where the one or more memory cells include a chalcogenide material.

An apparatus is described. The following provides an overview of aspects of the apparatus as described herein:

Aspect 21: An apparatus, including: a pillar extending through a plurality of levels of a memory array, where, at each level of the plurality of levels, one or more memory cells of the memory array are coupled with the pillar and a respective word line; a bit line; a first transistor and a second transistor in a series configuration with the first transistor, the first transistor and the second transistor configured to selectively couple the bit line with the pillar; a first gate line coupled with the first transistor; a second gate line coupled with the second transistor; a circuit coupled with the first gate line and the second gate line, the circuit including: a signal node coupled with the first gate line; a first inverter coupled with the signal node and the second gate line; and a second inverter coupled with the first inverter and the second gate line; and a decoder coupled with the circuit and configured to drive a signal to the signal node.

Aspect 22: The apparatus of aspect 21, further including: a first tile including the pillar and a second tile including a second pillar extending through the plurality of levels of the memory array, the first tile adjoining the second tile at a first edge of the first tile, where locations of the first inverter and the second inverter are associated with a second edge of the first tile opposite the first edge.

Aspect 23: The apparatus of any of aspects 21 through 22, further including: a first tile including the pillar and a second tile including a second pillar extending through the plurality of levels of the memory array, the first tile adjoining the second tile at a first edge of the first tile and a first edge of the second tile, where locations of the first inverter and the second inverter are associated with the first edge of the first tile and the first edge of the second tile.

Aspect 24: The apparatus of aspect 23, where the circuit further includes: a third inverter coupled with the signal node and a third gate line of the second tile; and a fourth inverter coupled with the third inverter and the third gate line of the second tile, where locations of the third inverter and the fourth inverter are associated with the first edge of the first tile and the first edge of the second tile.

Aspect 25: The apparatus of any of aspects 21 through 24, where to couple the bit line with the pillar, the apparatus is configured to bias the first gate line and the second gate line to a first voltage based at least in part on applying the signal to the signal node.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a pillar extending through a plurality of levels of a memory array, wherein, at each level of the plurality of levels, one or more memory cells of the memory array are coupled with the pillar and a respective word line;
   a bit line;
   a first transistor and a second transistor in a series configuration with the first transistor, the first transistor and the second transistor configured to selectively couple the bit line with the pillar;
   a first gate line coupled with the first transistor;
   a second gate line coupled with the second transistor;
   a circuit coupled with the first gate line and the second gate line, the circuit comprising:
      a third transistor coupled with the first gate line and a first signal node; and
      a fourth transistor coupled with a supply node and the first gate line; and
   a decoder coupled with the circuit and configured to activate and deactivate the third transistor and the fourth transistor.

2. The apparatus of claim 1, wherein the circuit further comprises:
   a fifth transistor positioned between the second gate line and a virtual ground node, wherein a gate of the third transistor and a gate of the fifth transistor are coupled with a second signal node.

3. The apparatus of claim 2, further comprising:
   a first tile comprising the pillar and a second tile comprising a second pillar extending through the plurality of levels of the memory array, the first tile adjoining the second tile at a first edge of the first tile, wherein locations of the third transistor, the fourth transistor, and the fifth transistor are associated with a second edge of the first tile opposite the first edge.

4. The apparatus of claim 2, further comprising:
   a first tile comprising the pillar and a second tile comprising a second pillar extending through the plurality of levels of the memory array, the first tile adjoining the second tile at a first edge of the first tile and a first edge of the second tile, wherein locations of the third transistor, the fourth transistor, and the fifth transistor are associated with the first edge of the first tile and the first edge of the second tile.

5. The apparatus of claim 2, further comprising:
   a first tile comprising the pillar and a second tile comprising a second pillar extending through the plurality of levels of the memory array, the first tile adjoining the second tile at a first edge of the first tile and a first edge of the second tile, wherein locations of the third transistor and the fifth transistor are associated with a second edge of the first tile opposite the first edge of the first tile and a location of the fourth transistor is associated with a second edge of the second tile opposite the first edge of the second tile.

6. The apparatus of claim 2, wherein the second gate line is coupled with the third transistor and the first gate line.

7. The apparatus of claim 2, wherein the fifth transistor and the fourth transistor are n-mos transistors and the third transistor is an p-mos transistor.

8. The apparatus of claim 2, wherein a gate of the third transistor and a gate of the fifth transistor are coupled with a third signal node and a gate of the fourth transistor is coupled with a fourth signal node.

9. The apparatus of claim 1, wherein:
the first gate line comprises a first conductive line coupled with a plurality of first transistors and a first via that extends orthogonal to the first conductive line, the first via coupling the first conductive line with the circuit; and
the second gate line comprises a second conductive line coupled with a plurality of second transistors and a second via that extends orthogonal to the first conductive line, the second via coupling the second conductive line with the circuit.

10. The apparatus of claim 1, wherein the circuit further comprises:
an inverter coupled with the second gate line, wherein a gate of the third transistor and an input of the inverter are coupled with a second signal node.

11. The apparatus of claim 1, wherein the circuit further comprises:
a fifth transistor coupled with the first gate line and the second gate line; and
a sixth transistor coupled with the fourth transistor and the first gate line, wherein a gate of the fifth transistor and a gate of the sixth transistor are coupled with a virtual ground node.

12. The apparatus of claim 11, wherein the fifth transistor is a p-mos transistor and the sixth transistor is an n-mos transistor.

13. The apparatus of claim 1, wherein the one or more memory cells comprise a chalcogenide material.

14. The apparatus of claim 1, further comprising:
a first tile comprising a first plurality of interleaved comb structures and a second plurality of interleaved comb structures, each interleaved comb structure comprising a first comb structure comprising a first plurality of word lines and a second comb structure comprising a second plurality of word lines, the first plurality of word lines being interleaved with the second plurality of word lines, the pillar coupled with a first word line of the first comb structure of the first plurality of interleaved comb structures and a second word line of the second comb structure of the first plurality of interleaved comb structures, wherein the first tile further comprises a first via positioned between the first plurality of interleaved comb structures and the second plurality of interleaved comb structures, the first via coupled with the first gate line and the second gate line.

15. The apparatus of claim 14, wherein the first gate line is coupled with a second via positioned between the first tile and a second tile comprising a second pillar extending through the plurality of levels of the memory array, the second pillar coupled with third via coupled with the first gate line, and the second gate line is coupled with a fourth via positioned between the first plurality of interleaved comb structures and the second plurality of interleaved comb structures.

16. The apparatus of claim 14, wherein the first gate line is coupled with a second via positioned between the first plurality of interleaved comb structures and the second plurality of interleaved comb structures and the second gate line is coupled with a third via positioned between the first plurality of interleaved comb structures and the second plurality of interleaved comb structures.

17. An apparatus, comprising:
a pillar extending through a plurality of levels of a memory array, wherein, at each level of the plurality of levels, one or more memory cells of the memory array are coupled with the pillar and a respective word line;
a bit line;
a first transistor and a second transistor in a series configuration with the first transistor, the first transistor and the second transistor configured to selectively couple the bit line with the pillar;
a first gate line coupled with the first transistor;
a second gate line coupled with the second transistor;
a circuit coupled with the first gate line and the second gate line, the circuit comprising:
a signal node coupled with the first gate line;
a first inverter coupled with the signal node and the second gate line; and
a second inverter coupled with the first inverter and the second gate line; and
a decoder coupled with the circuit and configured to drive a signal to the signal node.

18. The apparatus of claim 17, further comprising:
a first tile comprising the pillar and a second tile comprising a second pillar extending through the plurality of levels of the memory array, the first tile adjoining the second tile at a first edge of the first tile, wherein locations of the first inverter and the second inverter are associated with a second edge of the first tile opposite the first edge.

19. The apparatus of claim 17, further comprising:
a first tile comprising the pillar and a second tile comprising a second pillar extending through the plurality of levels of the memory array, the first tile adjoining the second tile at a first edge of the first tile and a first edge of the second tile, wherein locations of the first inverter and the second inverter are associated with the first edge of the first tile and the first edge of the second tile.

20. The apparatus of claim 19, wherein the circuit further comprises:
a third inverter coupled with the signal node and a third gate line of the second tile; and
a fourth inverter coupled with the third inverter and the third gate line of the second tile, wherein locations of the third inverter and the fourth inverter are associated with the first edge of the first tile and the first edge of the second tile.

21. The apparatus of claim 17, wherein, to couple the bit line with the pillar, the apparatus is configured to bias the first gate line and the second gate line to a first voltage based at least in part on applying the signal to the signal node.

* * * * *